United States Patent [19]

Kajimura

[11] Patent Number: 5,075,548
[45] Date of Patent: Dec. 24, 1991

[54] TUNNEL CURRENT PROBE MOVING MECHANISM HAVING PARALLEL CANTILEVERS

[75] Inventor: Hiroshi Kajimura, Tokyo, Japan

[73] Assignee: Olympus Optical Co., Ltd., Tokyo, Japan

[21] Appl. No.: 551,762

[22] Filed: Jul. 11, 1990

[30] Foreign Application Priority Data

Jul. 17, 1989 [JP] Japan .................. 1-184290
Feb. 9, 1990 [JP] Japan .................. 2-31211

[51] Int. Cl.⁵ .................. H01J 37/04; G21K 5/10
[52] U.S. Cl. .................. 250/306; 250/442.1
[58] Field of Search .................. 250/306, 307, 423 F, 250/442.1

[56] References Cited

U.S. PATENT DOCUMENTS

| | | | |
|---|---|---|---|
| 4,343,993 | 8/1982 | Binnig et al. | 250/306 |
| 4,506,154 | 3/1985 | Scire | 250/442.1 |
| 4,575,822 | 3/1986 | Quate | 365/174 |
| 4,668,865 | 5/1987 | Gimzewski et al. | 250/306 |
| 4,831,614 | 5/1989 | Duerig et al. | 250/306 |
| 4,880,975 | 11/1989 | Nishioka et al. | 250/306 |
| 4,894,538 | 1/1990 | Iwatsuki et al. | 250/307 |
| 4,906,840 | 3/1990 | Zdeblick et al. | 250/306 |

FOREIGN PATENT DOCUMENTS

0194323A1 9/1986 European Pat. Off.
2197752A 5/1988 United Kingdom.
2205680A 12/1988 United Kingdom.

*Primary Examiner*—Bruce C. Anderson
*Attorney, Agent, or Firm*—Frishauf, Holtz, Goodman & Woodward

[57] ABSTRACT

A tunnel current probe moving mechanism includes first and second substrates and at least two parallel cantilevers. The first substrate has a tunnel current probe group arranged on its surface. The tunnel current probe group includes probes which are two-dimensionally arranged at a predetermined pitch and have distal ends aligned within the same plane. The second substrate is arranged to oppose the tunnel current probe group on the first substrate, and can approach at a position where a tunnel current flows between the tunnel current probe group and the second substrate. These two cantilevers have the same length and are arranged parallel to each other on at least one of the first and second substrates. Each cantilever includes a plurality of piezoelectric driving members. When the piezoelectric driving elements are driven in response to a predetermined driving signal, the probe group is translated along the second substrate while a predetermined distance is kept between the probe group and the second substrate.

24 Claims, 17 Drawing Sheets

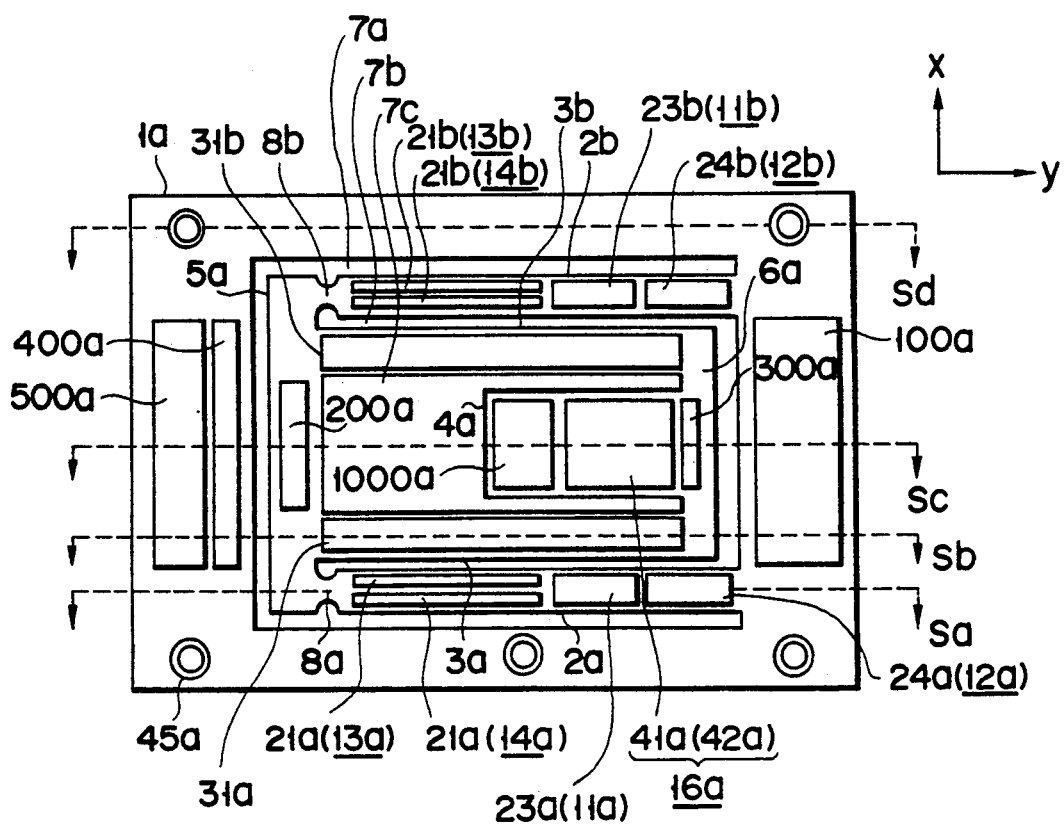
FIG. 2
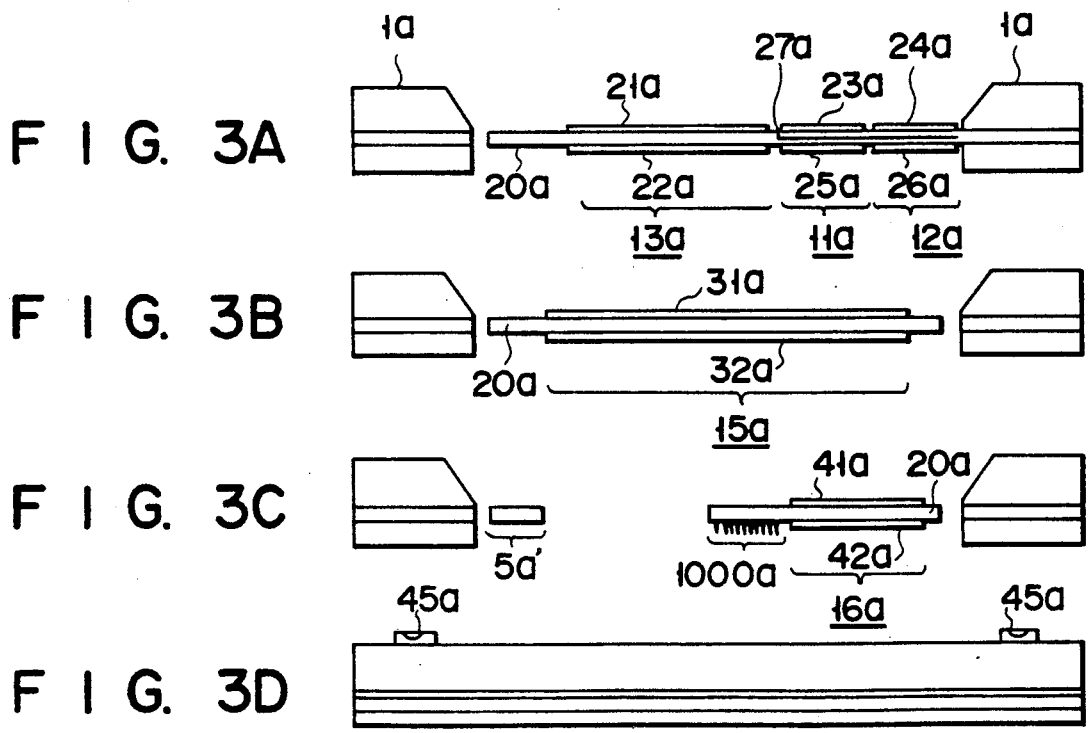
FIG. 3A
FIG. 3B
FIG. 3C
FIG. 3D

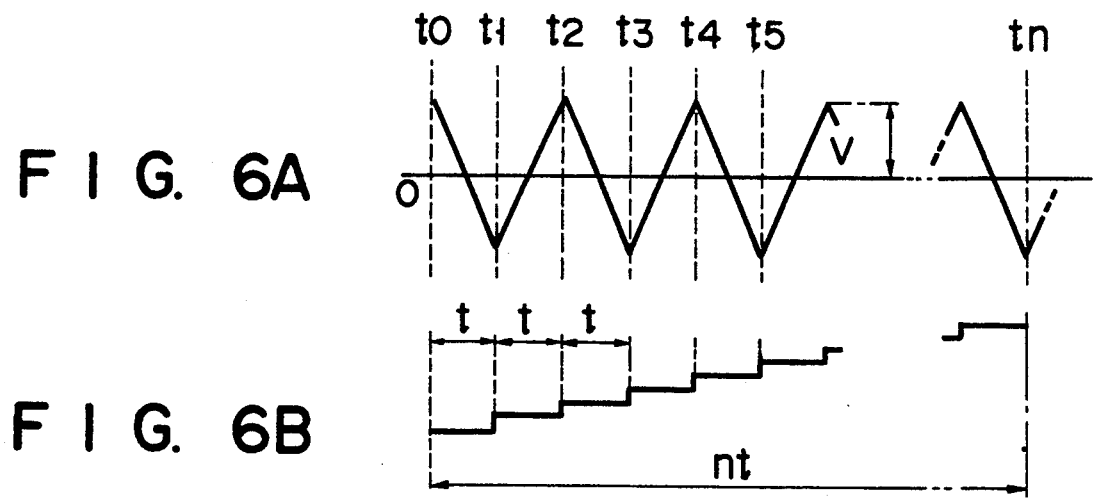
F I G. 6A
F I G. 6B
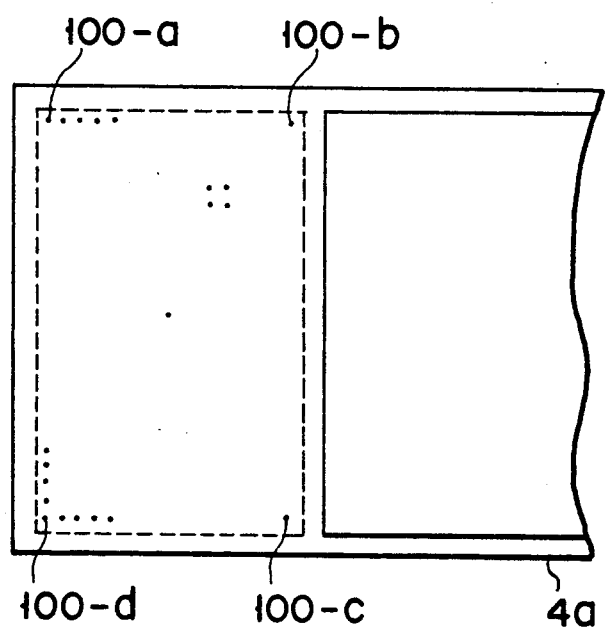
F I G. 7

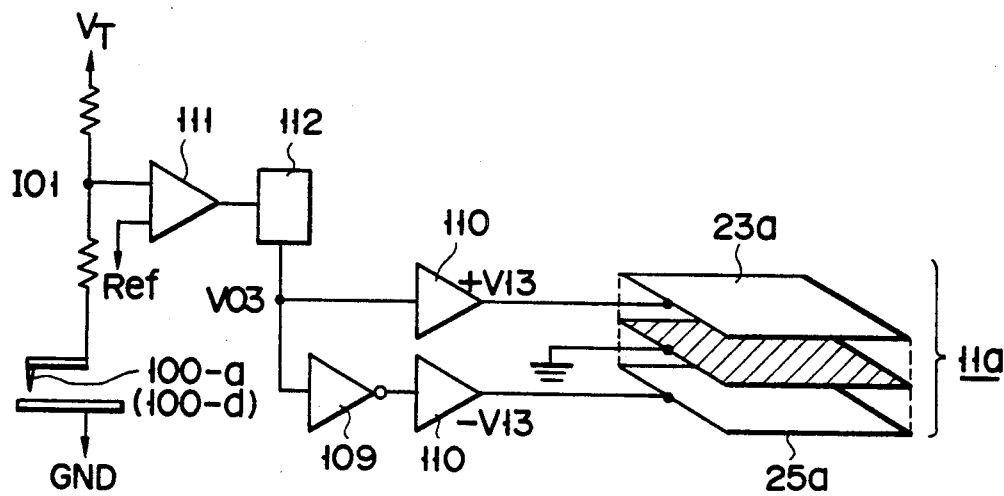
F I G. 8A
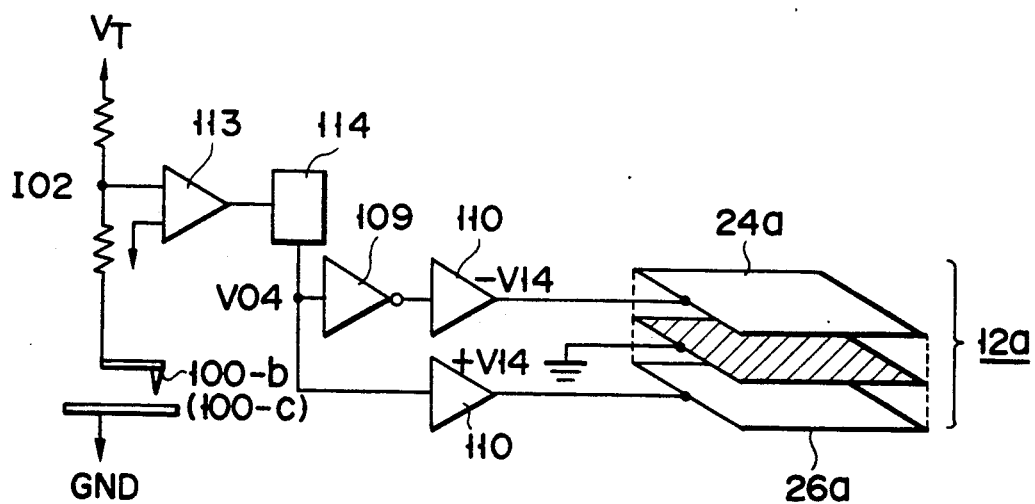
F I G. 8B

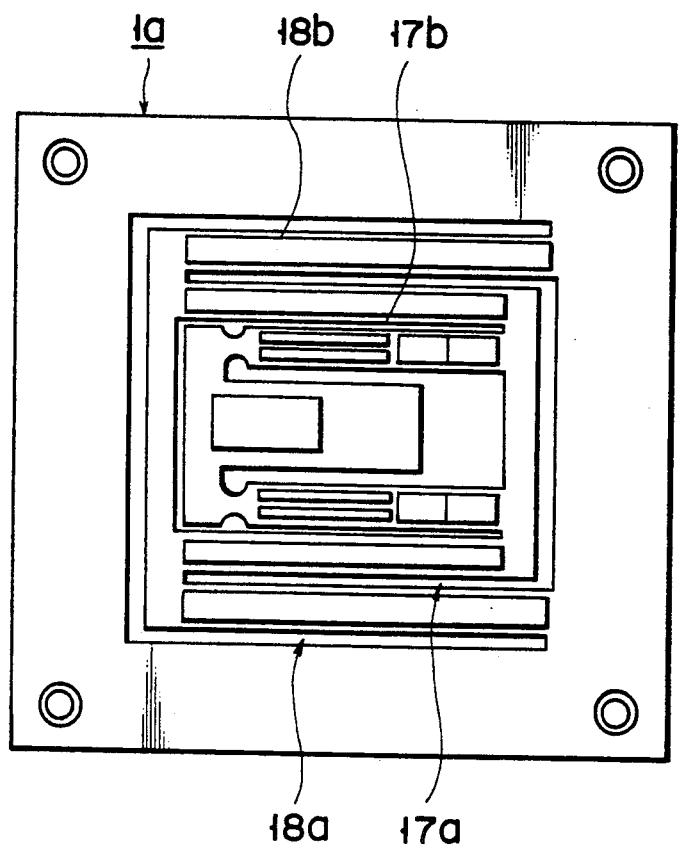
F I G. 12

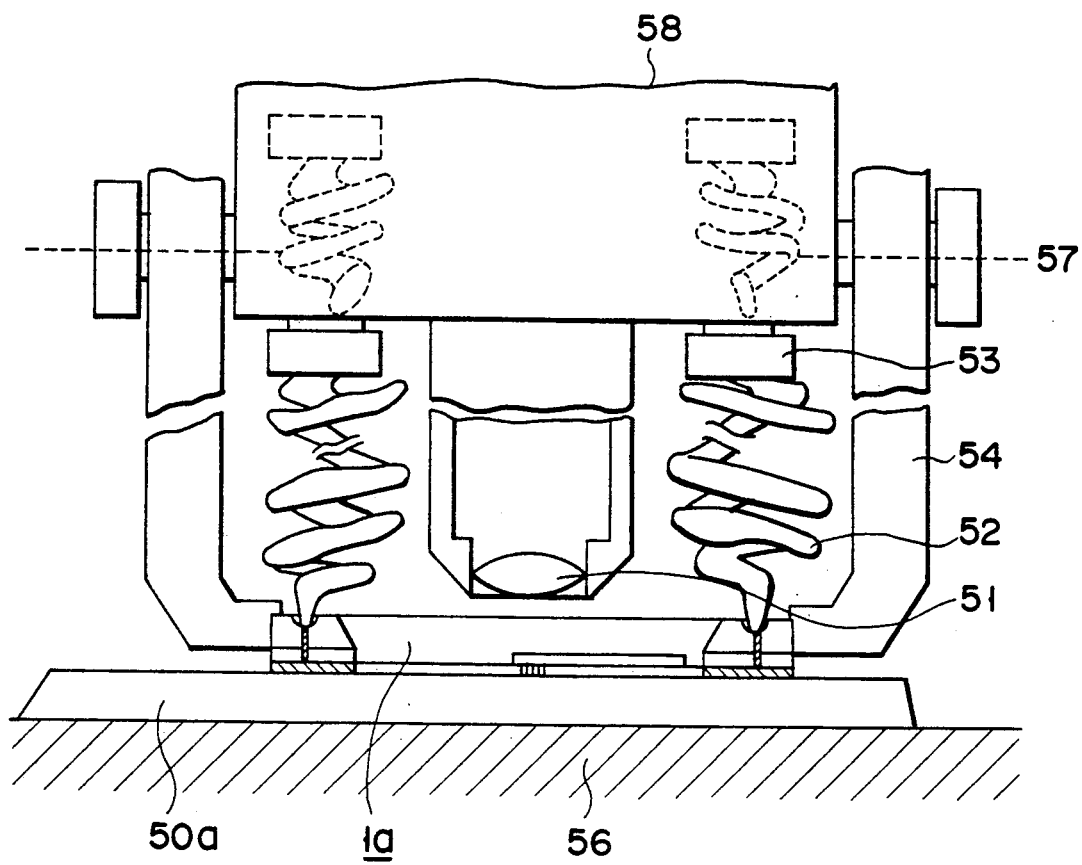
F I G. 13

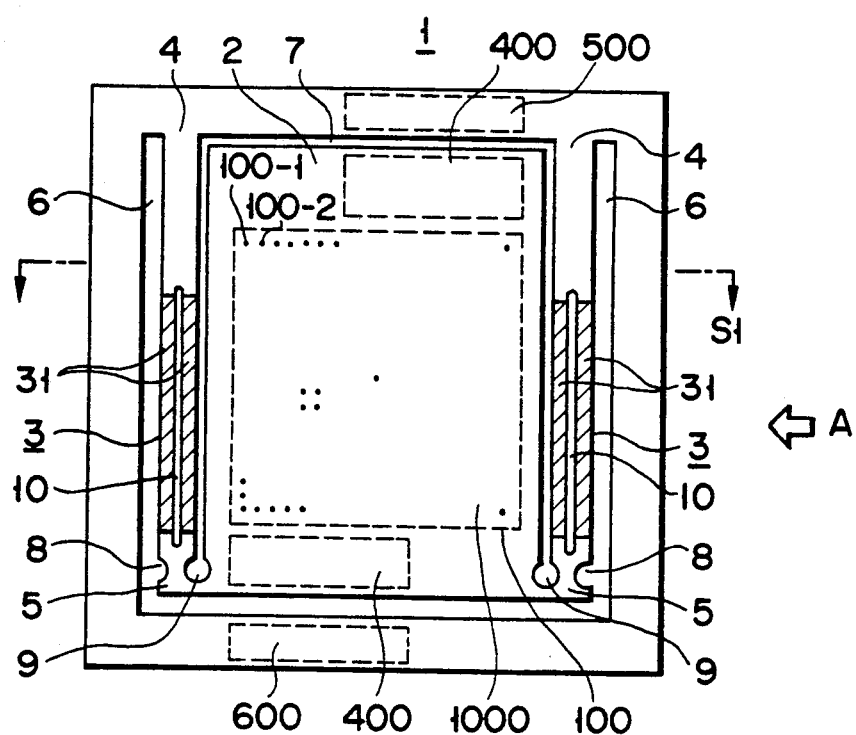
F I G. 14
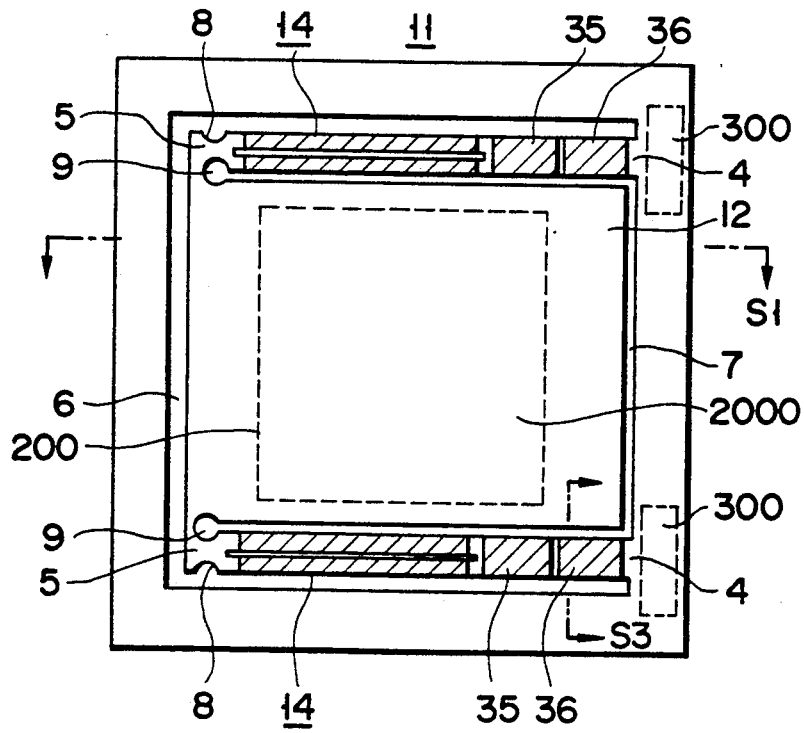
F I G. 15

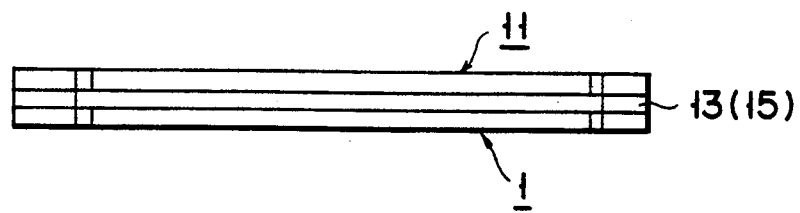
F I G. 16
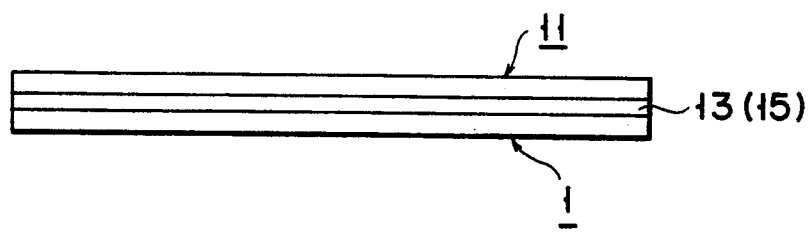
F I G. 17
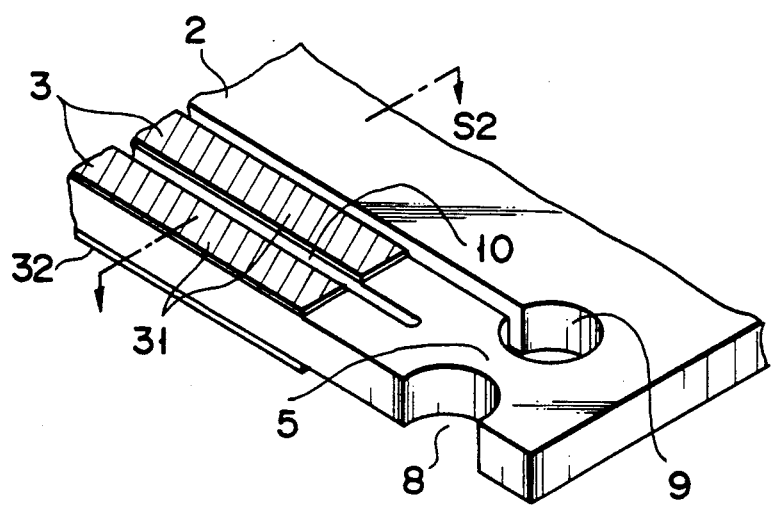
F I G. 18

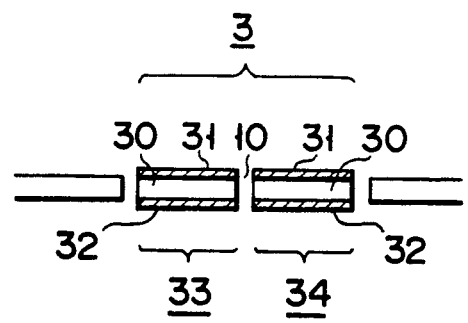
F I G. 19
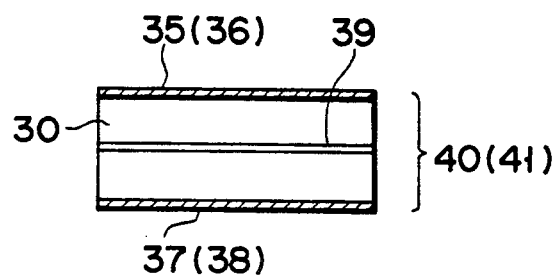
F I G. 20
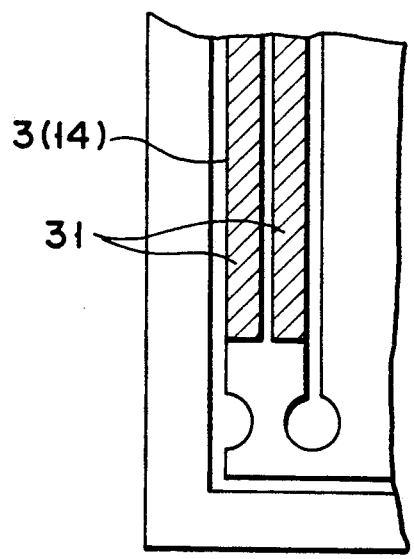
F I G. 21

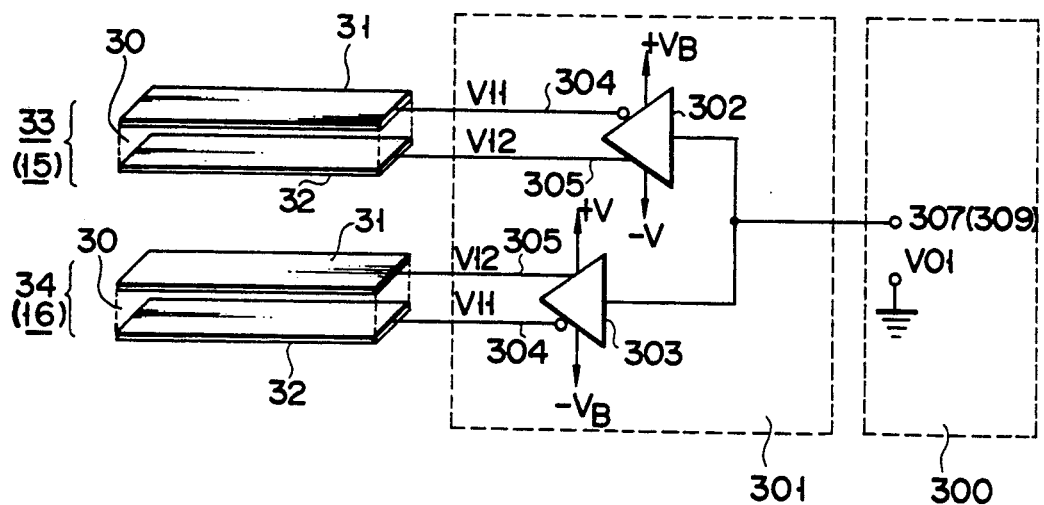
F I G. 22
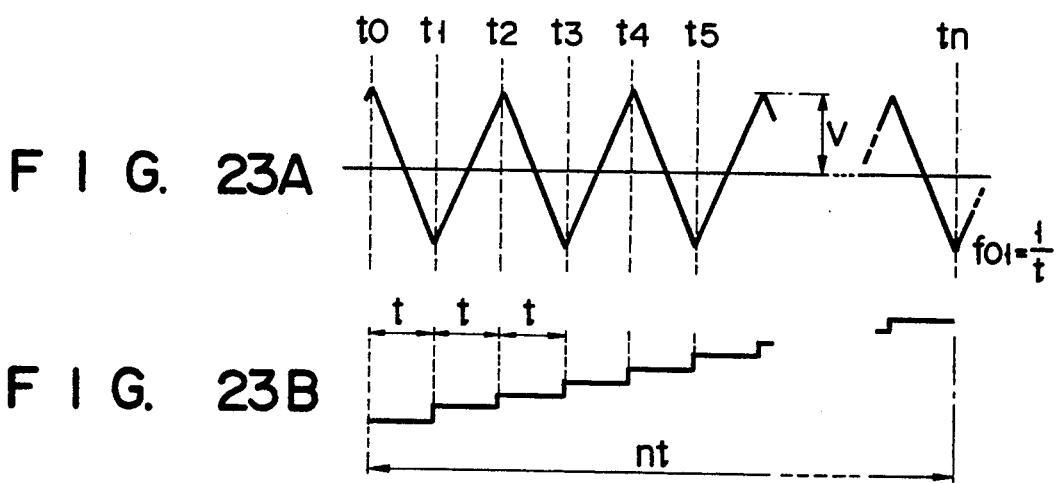
F I G. 23A
F I G. 23B

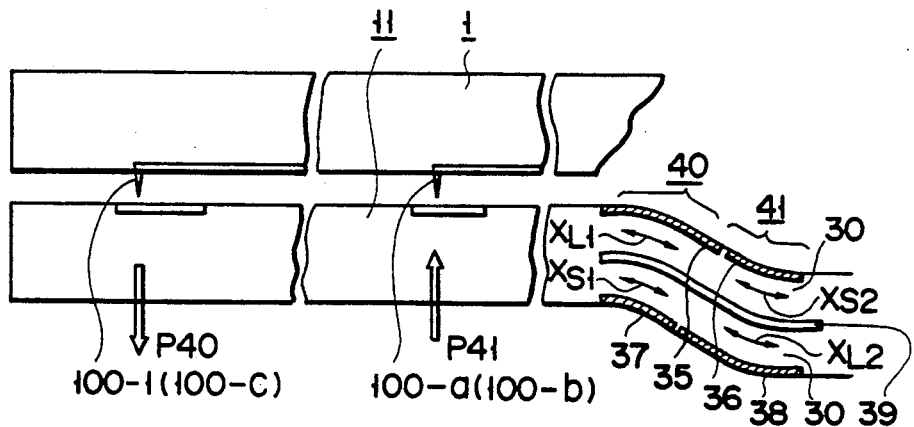
F I G. 24
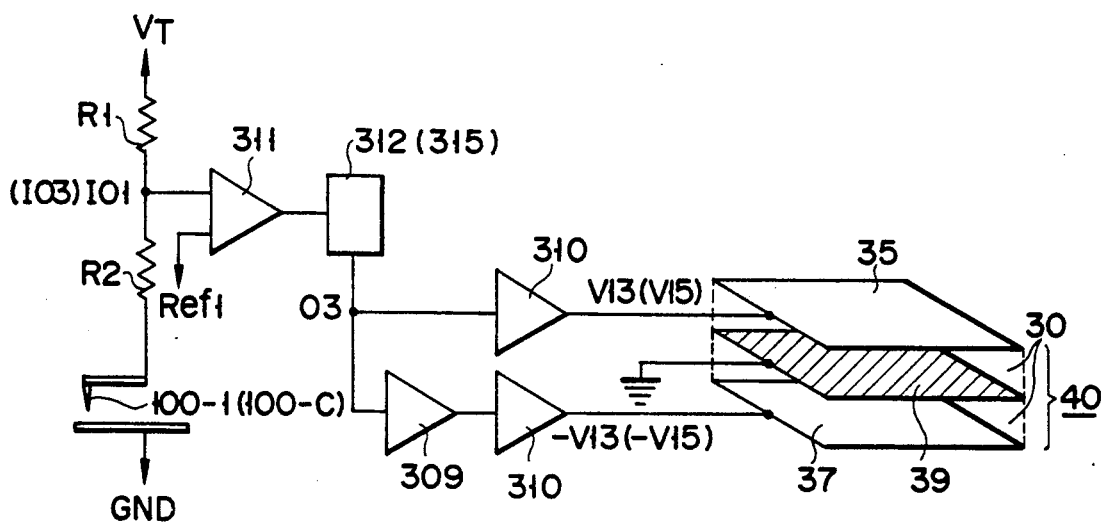
F I G. 25A

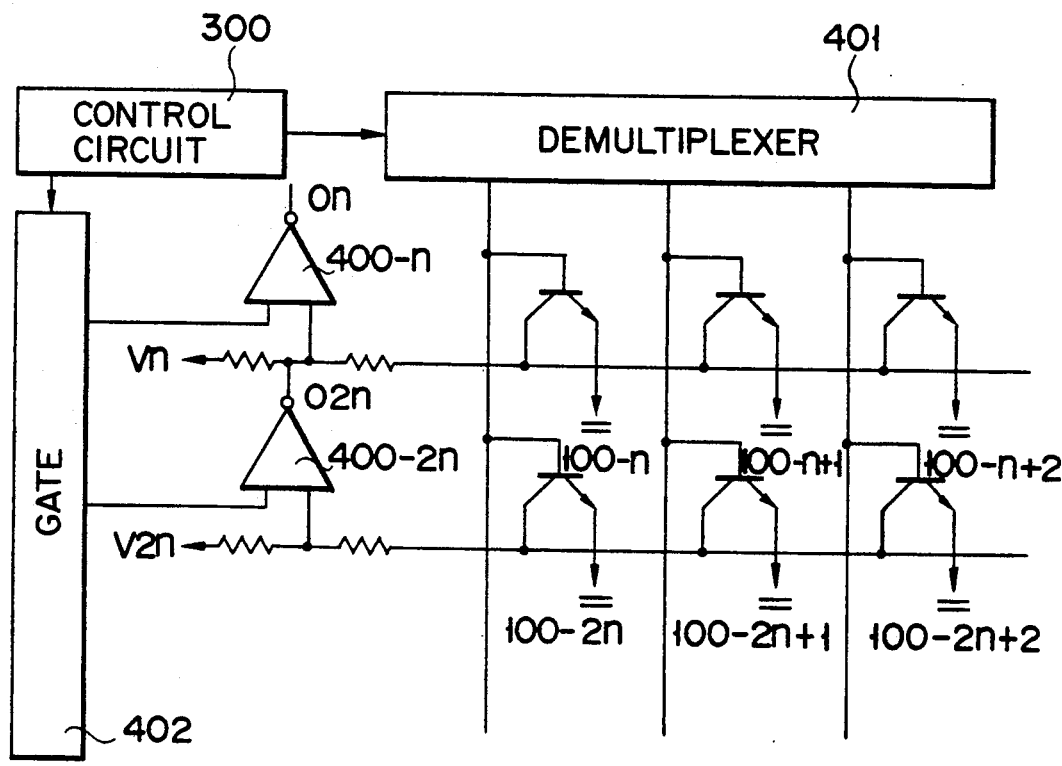
F I G. 27

TUNNEL CURRENT PROBE MOVING MECHANISM HAVING PARALLEL CANTILEVERS

BACKGROUND OF THE INVENTION

1. Field of the Invention

The present invention relates to a tunnel current probe moving mechanism for moving a large number of tunnel current probes along a substrate surface in order to observe a state of the substrate surface or to write or read desired data in or from the substrate.

2. Description of the Related Art

If a conductive sample is used as a substrate, and a large number of tunnel current probes are moved, i.e., scanned, along the sample, a fine surface pattern of the sample can be observed with a resolution of an atomic level. A tunnel current probe moving mechanism for such a scanning operation is called a scanning tunneling microscope (to be referred to as an STM hereinafter) and is developed by Binning et al. in IBM. The STM will be described below.

It is known that when a probe with a sharp point having a curvature radius of several 100 nm is caused to approach a surface of a conductive sample up to a distance of about 1 nm, and a predetermined voltage is applied between the probe and the sample, a tunnel current flows therebetween. This tunnel current is highly sensitive to a change in distance between the sample and the probe. With a distance change corresponding to, e.g., one atom, the tunnel current changed ten times or more in value. A microscope for observing a sample surface by using such properties of a tunnel current is a so-called STM. Assume that a probe is mounted on a three-dimensional driving member capable of moving in a three-dimensional direction. If this probe is two-dimensionally scanned on a sample surface in the X-Y direction while it is servo-controlled in a direction (Z-axis direction) perpendicular to the sample surface (X-Y plane) so as to keep the tunnel current constant, the probe traces irregularity of the sample surface with the distance to the sample surface being kept constant. A servo control amount of the probe in the Z-axis direction at this time is extracted in synchronism with a scanning signal in the X-Y direction, and the position of the distal end of the probe is output as a three-dimensional image, thereby observing the fine surface pattern of the sample as an image at the atomic level.

Note that if an observation surface of a sample is flat at the atomic level, a means may be used, which is designed to image a tunnel current detected when two-dimensional scanning of a probe is simply performed in the X-Y direction without performing the above-mentioned servo control in the Z direction.

When a small region on a sample surface is to be observed by the STM, according to a conventional method, the sample is observed first with an optical microscope to specify a required observation portion, and this portion is then observed in detail with the STM.

If, however, the optical microscope is to use an object optical system having a magnification of X50 to X100, which is frequently used, the operation range, i.e., the distance between the sample surface and the object lens is normally set to be several millimeters (about 5 mm at maximum). Since STMs using conventional tripod type and tube scanner type three-dimensional driving members are large in size, they cannot be inserted in the operation range. For every observation, therefore, the objective lens of the optical microscope and the probe unit of the STM must be exchanged. As a result, an observation position is shifted or a cumbersome operation is required.

Another problem of the conventional STM is associated with relative vibrations of a sample and a probe. Generally, floor vibration having an amplitude of about 1 μm and mainly constituted by frequency components of 100 Hz or less is observed even at a place where no vibration source exists near. This floor vibration causes the relative vibrations of a sample and a probe of the STM and appears as noise in an obtained STM image. As is well known, antivibration performance can be improved by softening an antivibration system and increasing the rigidity of the overall apparatus. For this reason, in the STM, the resonance frequency of an antivibration base must be decreased as much as possible, and that of the STM unit must be increased as much as possible (normally, 10 kHz). In the STM using the conventional tripod or tube scanner type three-dimensional driving member, however, since a probe scanning system for scanning a probe and a sample supporting system for supporting a sample are generally constituted as independent units, the rigidity of the overall apparatus is inevitably decreased. Since these two systems cannot constitute a resonance system having several 100 Hz, resonance easily occurs. That is, as described above, noise is generated in an STM image, and it is difficult to obtain an image having a high resolution at the atomic level. In order to solve the above-described two problems, C. F. Quate et al., Stanford University have developed a technique of forming a cantilever type STM (to be referred to as a micro STM hereinafter) having a size of 1,000 μm×200 μm×5 μm on a silicon substrate by using a microfabrication technique similar to the IC process. FIG. 1 is a perspective view showing a schematic arrangement of this micro STM. A cantilever 90 comprises a piezoelectric members (ZnO) 92 and 93 formed to sandwich an Al electrode 91, and strip-like Al electrodes 94, 95, 96, and 97 arranged in parallel in the longitudinal direction of the cantilever 90. The proximal end portion of the cantilever 90 is fixed to a silicon substrate. In addition, a probe 98 extends from a middle portion of the distal end portion of the cantilever 90. The cantilever 90 is connected to a tunnel current detector (not shown) through a wire (not shown).

When a sample is to be observed with such an arrangement, the silicon substrate surface of the micro STM is urged/fixed against/to the sample surface, and the probe is scanned by the above-described cantilever 90 to detect a tunnel current.

The principle of probe scanning of the micro STM developed at Stanford University will be described below with reference to FIG. 1.

If voltages ar applied to the electrodes 94 and 91, an electric field E4 is generated to be directed from the electrode 94 to the electrode 91. In this case, a portion of the piezoelectric member 92 which is sandwiched between the electrodes 94 and 91 expands in the positive X-axis direction shown in FIG. 1. This can be equally applied to other electrodes. The magnitudes of electric field vectors E1, E2, E3, and E4 shown in FIG. 1 and the scanning directions of the probe 98 have the following relationship:

X: positive direction E1=E2=E3=E4>0
: negative direction E1=E2=E3=E4<0
Y: positive direction E1=E2<E3=E4
: negative direction E1=E2>E3=E4
Z: positive direction E1=E3>E2=E4
: negative direction E1=E3<E2=E4

That is, the probe is three-dimensionally driven in the X direction by expanding/contracting the entire cantilever 90. In the Y and Z directions, the probe is driven by expanding one piezoelectric member while contracting the other piezoelectric member so as to distort the entire cantilever 90. As a result, the cantilever 90 is displaced by 2.2 nm/V in the X direction, by 22 nm/V in the Y direction, and by 770 nm/V in the Z direction. By adjusting voltages to be applied to the electrodes in this manner, the probe 98 on the distal end of the cantilever 90 is three-dimensionally scanned.

Such a cantilever type micro STM can be inserted in the operation range of an optical microscope. Therefore, after an observation portion is specified by observing a wide area of a sample surface by the optical microscope, the observation portion can be directly observed in detail with the STM without exchanging the objective lens and the probe unit. In addition, since the cantilever of this micro STM is urged/supported against/on the sample surface, the probe and the sample can be substantially integrated. That is, the resonance frequency between the probe and the sample depends on only the resonance frequency of the cantilever itself, and can be increased to several 10 to 100 kHz. As a result, an STM apparatus having high rigidity can be realized, and an STM image free from the influences of vibrations and having no noise can be obtained.

According to the above-described micro STM developed at Stanford University, however, when the probe is to be moved in, e.g., the Y-axis direction in FIG. 1, the probe is scanned in the form of an arc as the Y displacement of the probe is increased. Therefore, if an irregularity signal obtained by this arcuated scanning is directly output, the obtained image is distorted with respect to the actual sample surface. That is, portions where the probe can be substantially linearly scanned are portions where the Y and Z displacements of the cantilever are close to zero. This greatly reduces the effective scanning range.

Furthermore, the displacement of the cantilever in the three directions, i.e., the X, Y, and Z directions with respect to the same driving voltage varies. For this reason, in order to obtain the same displacement in the X and Y directions, for example, a larger driving voltage is required for displacement in the X direction, and a circuit arrangement is complicated. If the cantilever is driven by the same voltage in the X and Y directions, a displacement in the Y direction becomes smaller than that in the X direction. This elongates the scanning surface of the probe, and hence an elongated STM image is obtained. In order to obtain a substantially square STM image, which is easy to observe, a plurality of times of scanning operations are required.

On the other hand, C. F. Quate et al., Stanford University proposed an apparatus capable of storing data at a density of atomic or molecular level by replacing a sample with a proper recording medium. This apparatus is designed such that a tunnel current probe is arranged on the distal end of a cantilever, which incorporates a piezoelectric driving member and has a length of 1,000 μm, a width of 20 μm and a thickness of 5 μm, by the IC process. With this arrangement, this apparatus is stably operated against external vibrations as an STM.

Subsequently, the present applicants proposed a data memory whose storage capacity is multiplied by increasing the number of tunnel current probes to n to multiply the storage capacity by n times, or by forming a plurality of cantilevers on the same IC substrate.

In general, the storage capacity can be increased by increasing the number of cantilevers on the same substrate. In addition, a data amount which can be stored and reproduced is proportional to the scanning range of a tunnel current probe. This range depends on the length of a cantilever. Therefore, the scanning range of a probe can be increased with an increase in length of a cantilever. However, if the length of a cantilever is increased, the scanning efficiency is degraded as compared with the are of the overall apparatus.

In addition, since the scanning distance is decreased toward the proximal end of a cantilever, only the area of the distal end portion becomes an effective scanning range.

For this reason, the distal end portion of a cantilever may be increased in area so that a large number of tunnel current probes can be arranged. In this method, however, since an operation of the cantilever becomes unstable and the operation stability of the overall apparatus is impaired.

SUMMARY OF THE INVENTION

It is the first object of the present invention to provide a tunnel current probe moving mechanism in which the scanning range of a probe is expanded by using parallel cantilevers, and a substantially square STM image faithfully representing the actual fine surface pattern of a sample can be obtained.

It is the second embodiment of the present invention to provide a tunnel current probe moving mechanism which can perform a stable operation by holding a probe substrate to be parallel on the distal ends of parallel cantilevers.

In order to achieve the above objects, according to the present invention, there is provided a tunnel current probe moving mechanism comprising:

a first substrate including a tunnel current probe group on a surface thereof, the tunnel current probe group having tunnel current probes two-dimensionally arranged at a predetermined pitch and having distal ends aligned within the same plane;

a second substrate arranged to oppose the tunnel current probe group on the first substrate and capable of approaching a position where a tunnel current flows between the tunnel current probe group and the second substrate; and at least two parallel cantilevers, having the same length and arranged parallel to each other on at least one of said first and second substrates, each of the cantilevers having a plurality of piezoelectric driving members, wherein when the piezoelectric driving members are driven in response to a predetermined driving signal, the probe group is translated along the second substrate while a predetermined distance is kept between the probe group and the second substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

The above-described aspect and other features of the present invention will be explained in a detailed description of preferred embodiments given below with reference to the accompanying drawings, in which:

FIG. 2 is a plan view showing a micro STM according to the first embodiment of the present invention;

FIGS. 3A to 3D are sectional views taken along dotted lines S1, S2, S3, S4, and S5 in FIG. 2, respectively;

FIGS. 6A and 6B are timing charts showing driving signals for scanning a probe group;

FIG. 7 is an enlarged view of the probe group;

FIGS. 8A, 8B, and 8C are schematic views respectively showing circuits for setting the probe group and a sample to be parallel to each other;

FIG. 12 is a plan view showing a modification of the first embodiment;

FIG. 13 is a view showing a unit for inserting the micro STM between an objective lens and a sample;

FIG. 14 is a top view showing a first substrate including a probe substrate of a data memory according to the second embodiment of the present invention;

FIG. 15 is a bottom view showing a second substrate including a medium substrate;

FIGS. 16 and 17 are side views showing a state wherein the first and second substrates are stacked on each other;

FIG. 18 is a perspective view showing a hinge portion for connecting a cantilever to the probe or medium substrate;

FIG. 19 is a sectional view of the cantilever taken at a position indicated by an arrow S2;

FIG. 20 is a sectional view of the cantilever taken at a position indicated by an arrow S3;

FIG. 21 is a view showing another embodiment of the cantilever;

FIG. 22 is a view showing a piezoelectric driving circuit for laterally bending cantilevers;

FIGS. 23A and 23B are timing chart showing driving signals for driving parallel cantilevers;

FIG. 24 is a view for explaining an operation of causing the probe and medium substrates to approach each other;

FIGS. 25A and 25B are circuit diagrams respectively showing circuits for driving bimorph cells for causing the probe and medium substrate to approach each other;

FIG. 27 is a view showing a circuit for dividing the probe group into groups.

DETAILED DESCRIPTION OF THE PREFERRED EMBODIMENTS

The first embodiment of the present invention will be briefly described below. In this embodiment, a tunnel current probe moving mechanism of the present invention is realized as an STM.

More specifically, in the first embodiment of the present invention, a micro STM is designed such that two parallel cantilevers incorporating piezoelectric driving members are arranged in a frame member using a silicon wafer as a substrate and having a size of several mm $\times$ several mm, a plurality of probes are two-dimensionally arranged on the distal end portions of the parallel cantilevers at a predetermined pitch, and the plurality of probes are scanned by controlling the piezoelectric driving members.

According to such an arrangement, similar to the micro STM developed at Stanford University, this micro STM can be set within the operation distance of an optical microscope and is free from the problem of probe-sample relative vibration.

Figure 1:
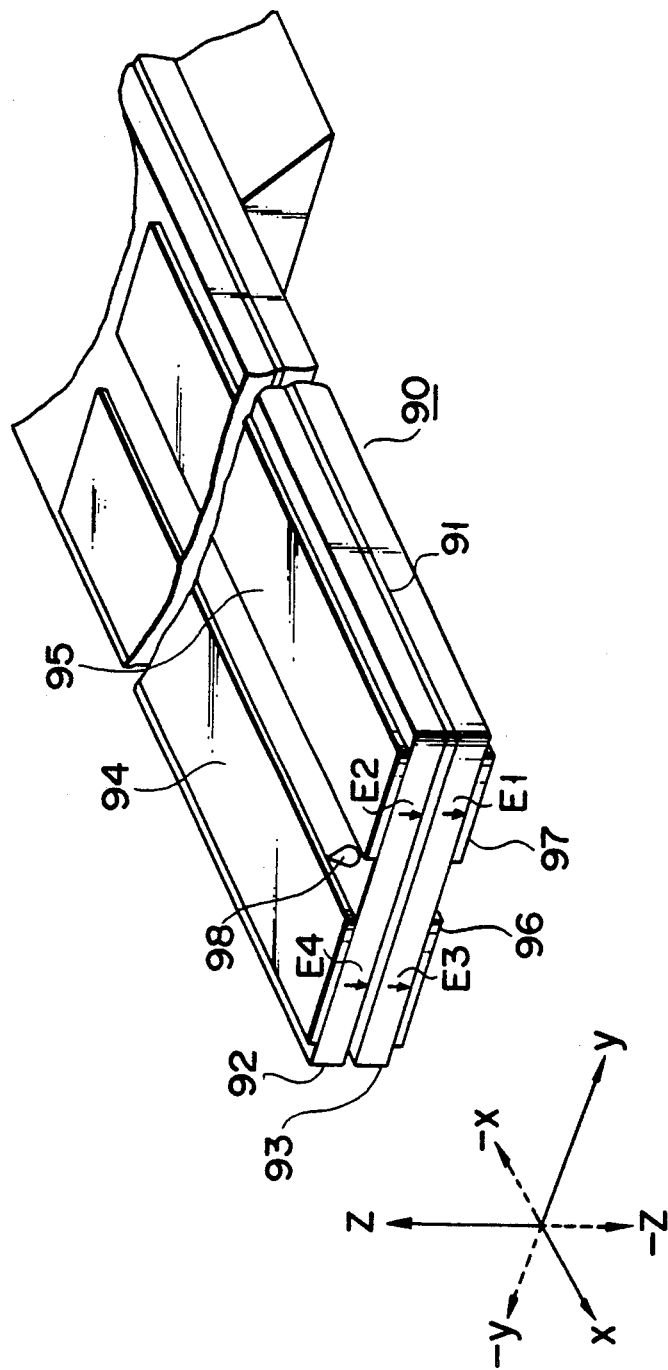
FIG. 1 is a perspective view showing an arrangement of a conventional micro STM.

In addition, according to the micro STM of the present invention, since the plurality of probes are scanned by the parallel cantilevers, the probes are not scanned in the form of an arc but are linearly scanned, unlike the STM described with reference to FIG. 1.

Furthermore, owing to these cantilevers, the effective scan range of each probe in the X, Y, and Z directions is expanded, and X, Y, and Z displacements with respect to the same driving voltage are not offset.

The first embodiment of the present invention will described below with reference to FIGS. 1 to 9.

FIG. 2 is a plan view schematically showing a micro STM of this embodiment. FIGS. 3A to 3D are sectional views taken along dotted lines Sa, Sb, Sc, and Sd in FIG. 2, respectively.

Referring to FIG. 2, reference numeral 1a denotes a frame-like 11 mm $\times$ 6 mm STM chip substrate constituted by a silicon substrate which underwent a mirror surface process. Inside the STM chip substrate 1a, first to third U-shaped notches 7a, 7b, and 7c are formed in a piezoelectric substrate consisting of PZT or the like by etching or the like so as to be sequentially stacked on each other in such a manner that the opening ends of the respective notches oppose each other. The second notch is smaller than the second notch, and the third notch is smaller than the second notch. That is, first cantilevers 2a and 2b, second cantilevers 3a and 3b, a probe cantilever 4a, a first intermediate substrate 5a, and a second intermediate substrate 6a are for by these notches.

The first parallel cantilevers 2a and 2b will be described below with reference to FIGS. 2, 3A, 4A, and 4B.

The cantilevers 2a and 2b extend from one side of the frame of the substrate 1a and support the intermediate substrate 5a at their distal end portions through hinge portions 8a and 8b. As shown in FIG. 3A, an electrode 27a is arranged in the middle of a portion of a piezoelectric member 20a close to the STM chip substrate 1a. In addition, four electrodes 23a, 24a, 25a, and 26a are arranged in pairs in series in the longitudinal direction on the upper and lower surfaces of the piezoelectric member 20a which oppose the electrode 27a. These four electrodes are connected to a control circuit 100 through wires (not shown) and are designed to selectively apply voltages to the piezoelectric member 20a while the electrode 27a is used as a common electrode. The electrodes 23a, 25a, and 27a constitute a bimorph cell 11a. The electrodes 24a, 26a, and 27a constitute a bimorph cell 12a.

Figure 4A:
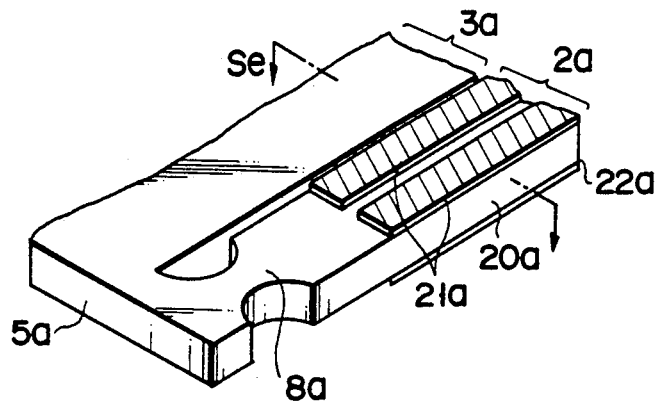
FIGS. 4A and 4B are a perspective view and a sectional view, respectively, showing parallel cantilevers.
Figure 4B:
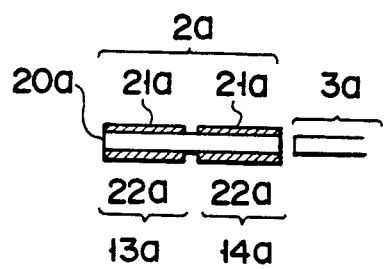

FIG. 4A is an enlarged perspective view of a portion of the cantilever 2a close to the intermediate substrate 5a. FIG. 4B is a sectional view taken along a dotted line Se in FIG. 4A. Referring to FIGS. 4A and 4B, reference numerals 21a and 22a denote strip-like electrodes arranged on the upper and lower surfaces of the piezoelectric member 20a so as to be in parallel in the longitudinal direction of the cantilever. These electrodes 21a and 22a are connected to the control circuit 100 on the silicon substrate through wires (not shown) and are designed to selectively apply a voltage to the piezoelectric member 20a. As shown in FIG. 4B, these electrodes 21a and 22a constitute piezoelectric elements 13a and 14a. A semicircular notch is formed in the hinge portion 8a for connecting the cantilever 2a to the intermediate substrate 3a, and is designed to increase a displacement of the cantilever 2a in the X direction in the coordinate system in FIG. 2.

Note that the cantilever 2b has the same arrangement as that of the cantilever 2a and hence a detailed description thereof will be omitted.

The second parallel cantilevers 3a and 3b will be described below with reference to FIGS. 2 and 3B.

The cantilevers 3a and 3b extend from the above-mentioned first intermediate substrate 5a and support the second intermediate substrate 6a at their end portions. Referring to FIG. 3B, reference numerals 31a and 32a denote electrodes arranged on the upper and lower surfaces of the piezoelectric member 20a of the parallel cantilever 3a. The electrodes 31a and 32a are connected to the control circuit 100 through wires (not shown) and are designed to selectively apply voltages to the piezoelectric member 20a. The electrodes 31a and 32a and the piezoelectric member 20a constitute a piezoelectric driving member 15a. Similar to the cantilever 3a, electrodes 31b and 32b are arranged to sandwich the piezoelectric member 20a so as to constitute a piezoelectric driving member 15b.

The probe cantilever 4a will be described below with reference to FIGS. 2 and 3C.

The probe cantilever 4a extends from the second intermediate substrate 6a. Conductive probes 100-X (100-1, 100-2, 100-3, . . . , 100-a, 100-b, 100-c, and 100-d) (X = 1, 2, 3, . . . to be referred to as a probe group 1000 hereinafter) are formed on a middle portion of the distal end of the second intermediate substrate 6a so as to be arranged in the form of a two-dimensional lattice on the order of microns and submicrons. Referring to FIG. 3C, reference numerals 41a and 42a denote electrodes arranged on the upper and lower surfaces of the piezoelectric member 20a of the probe cantilever 4a. The electrodes 41a and 42a are connected to the control circuit 100 through wires (not shown) and are designed to selectively apply voltages to the piezoelectric member 20a. The electrodes 41 and 42a and the piezoelectric member 20 a constitute a piezoelectric driving member 16a.

As the above-mentioned probe group 100, $50 \times 50 = 25 \times 10^2$ robes are arranged at a pitch of 2 μm within a 1.0 mm × 0.1 mm region of the distal end portion of the probe cantilever 4a by using the method of forming a probe group based on the semiconductor process, which is developed at Stanford University.

The probes of the probe group are connected to an amplifier 300a, which is arranged near the probe cantilever 4a, through conductive wires (not shown). These probes may be arranged in groups for signal processing (to be described later) as needed. The amplifier 100a is either connected to an input/output circuit 500a on the STM chip substrate 1a through a multilayer wiring pattern or is designed to communicate with input/output circuits 200a and 400a through light or like, thus transmitting signals from the probes. In addition, contact lands 45a each having a plurality of recesses are formed on the upper surface of the STM chip 1a. The contact lands 45a are connected to the input and output terminals of the circuits 100a, 200a, 300a, 400a, 500a, and the like through wires (not shown) so as to be used to input/output signals to external units.

The above-described electrodes, piezoelectric members, probes, wires, circuits, and the like are formed in proper steps by semiconductor process using mask works, e.g., deposition and etching.

Driving circuits for the above-mentioned piezoelectric driving members 11a to 16a will be described below.

Figure 5:
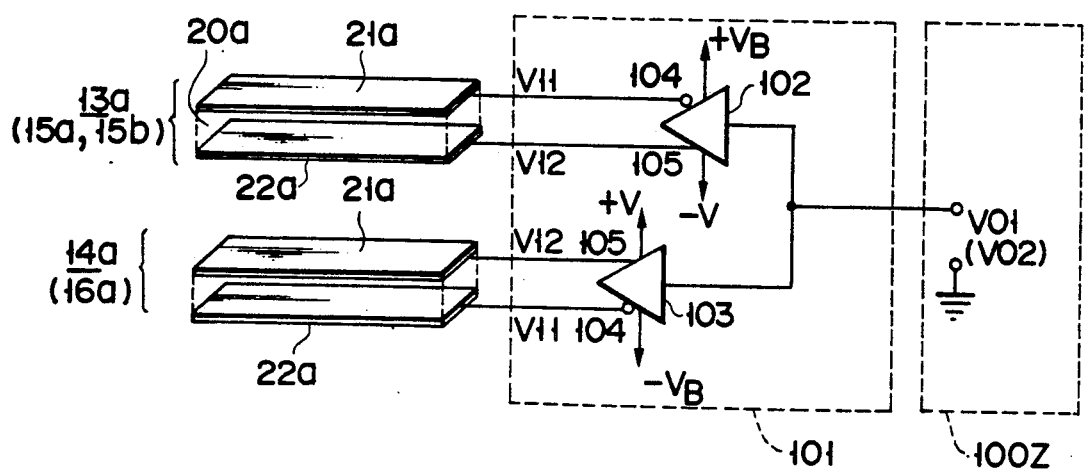
FIG. 5 is a circuit diagram showing a driving circuit for driving piezoelectric driving members.

A driving circuit 101 for the piezoelectric driving members 13a 14a as piezoelectric driving members for driving the probes in the X direction will be described below with reference to FIG. 5.

A driving signal V01 generated by a control circuit 100z is input two voltage amplifiers 102 and 103. Positive and negative voltages +VB and −V of 2 to 30 V are applied to the voltage amplifiers 102 and 103, and voltage V11 and V12 are output from output terminals 104 and 105 so as to have opposite phases. The output 104 and 105 are respectively connected to the electrodes 21a 22a of the piezoelectric driving member 13a so as to apply the voltage V11 and V12 thereto. The output terminals 105 and 104 are respectively applied to the electrodes 21a and 22a of the piezoelectric driving member 14a so as to apply the voltages V12 and V11 thereto.

FIG. 6A shows the driving signal V01 for the piezoelectric driving members 13a 14a. As shown in FIG. 6A, this signal is continuously changed in voltage as +V, −V, +V, . . . at a predetermined period t. When this driving signal V01 is input to the driving circuit 101, the voltage amplifiers 102 and 103 respectively output signals V11 and V12 having opposite phases and continuously changed in voltage at the predetermined period t. These signals V11 and V12 are respectively input to the piezoelectric driving members 13a and 14a. As a result, the piezoelectric driving elements 13a and 14a alternately expand and contract repeatedly. With this operation, the cantilevers 2a and 2b are laterally moved (in the X-axis direction) to perform scanning of the probes in the X direction.

A relationship in connector between the voltage amplifiers of the piezoelectric driving members 15a, 15b, and 16a as Y-direction piezoelectric driving members and the electrodes will be described below.

The relationship in connection between the amplifiers of the piezoelectric driving members 15a, 15b, and 16a and the electrodes is equivalent to that in the arrangement wherein the piezoelectric driving member 13a is replaced with piezoelectric driving members 15a and 15b, and the piezoelectric driving member 14a is replaced with the piezoelectric driving member 16a. That is, the same driving signal is supplied to the piezoelectric driving members 15a and 15b, whereas a driving signal having a phase opposite thereto is supplied to the piezoelectric driving member 16a. In this case, however, a driving signal V102 shown in FIG. 6B is used in place of the signal V01.

The driving signal V02 for the piezoelectric driving elements 15a, 15b, and 16a will be described below. The signal shown in FIG. 6B is a signal whose voltage is increased by a predetermined value at the predetermined period t. When this driving signal V02 is input to the driving circuit 101, the voltage amplifiers 102 and 103 respectively output signals V21 and V22 which has opposite phases and are increased in voltage by a predetermined value at the predetermined period t. These signals V21 and V22 are respectively input to the piezoelectric driving members 15a and 15b and the piezoelectric driving member 16a. As a result, one end of each of the piezoelectric driving members 15a, 15b, and 16a expands by a predetermined amount at the predetermined period t while the other end thereof contracts by a predetermined amount at the predetermined period t. This operation is performed because the proximal and distal ends of the cantilevers 3a and 3b and the probe cantilever 4a are alternately arranged. With this operation, the cantilevers 3a and 3b and the probe cantilever 4a scan the probes in the same direction along the Y direction.

A driving circuit for the bimorph cells 11a and 12a as Z-direction piezoelectric driving members for the probes will be described below with reference to FIGS. 7 and 8A to 8C.

FIG. 7 is an enlarged view of a distal end portion of the probe cantilever 4a including the probe group 1000. Of the probes 100-a, 100-b, 100-c, and 100-d on the four corners of the probe group 1000 shown in FIG. 7, the probe 100-a (or 100-d) is a tunnel current probe for driving the bimorph cell 11a. FIG. 8A shows a driving circuit for the bimorph cell 11a. Referring to FIG. 8A, a tunnel current probed by the probe 100-a (or 100-d) is input to a servo circuit 112 through a tunnel current detector 111. An output voltage V03 from the servo circuit 112 is applied to the electrodes 23a through an amplifier 110 and is also applied to the electrode 25a through an inverter 109 and another amplifier 110 so that positive and negative voltages +V13 and −V13 are respectively applied to the electrodes 23a and 25a.

The probe 100-b (100-c) shown in FIG. 7 is a tunnel current probe for driving the bimorph cell 12a. FIG. 8B shows a driving circuit for the bimorph cell 12a. Referring to FIG. 8B, a tunnel current probed by the probe 100-b is input to a servo circuit 114 through a tunnel current detector 113. An output voltage from the servo circuit 114 is applied to the electrode 26a through an amplifier 110 and is also applied to the electrode 24a through an inverter 109 and another amplifier 110 so that voltages −V14 and +V14 having opposite polarities are respectively applied to the electrodes 24a and 26a.

An operation of setting the probe group 1000 near a sample 50a in the micro STM having the above-described embodiment will be described below with reference to FIGS. 8A to 8C.

In the micro STM apparatus of the present invention, before the power source is turned on, the probe group 1000 is separated from the sample 50a at a predetermined distance, and no tunnel currents flow in the probes. After the power source is turned on, the control circuit 100 applies a voltage to generate a potential difference between the electrodes 24a and 26a of the bimorph cell 12a and a common electrode 27a. As shown in FIG. 8C, at this time, expansion/contraction amounts XS2 and XB2 of the upper and lower layers of the piezoelectric member 20a have a relationship XS2>XB2, i.e., the lower layer becomes shorter than the upper layer, and hence the cantilever 2a is bent downward. With this operation, the distal end portion of the probe group 1000 is moved downward, and the probe 100-a (or 100-d) located near the distal end approaches a tunnel region first.

When a tunnel current is detected by the probe 100-a (or 100-d), the detector 111 operates the servo circuit 112 in FIG. 8A to cause the amplifier 110 to properly output the voltage V13 or −V13 to the piezoelectric driving member 11a so as to maintain the current flowing in the probe 100-a (or 100-b) at a value I01 (constant value).

Meanwhile, the negative and positive voltages −V14 and +V14 are respectively applied to the electrodes 24a and 26a of the piezoelectric driving member 12a. Therefore, in contrast to the piezoelectric driving member 11a, expansion/contraction amounts XS1 and XB1 of the upper and lower layers of the piezoelectric driving member 12a has a relationship XS1<XB1, i.e., the lower layer becomes longer than the upper layer. As a result, the cantilever 2a is bent upward. With this bending, the proximal end portion of the probe group 1000 is moved downward, and the probe 100-b (or 100-c) located near the proximal end approaches the tunnel region.

When a tunnel current is detected by the probe 100-b (or 100-c), the detector 113 operates the servo circuit 114 in FIG. 8B to cause the amplifier 110 to properly output the voltage V14 or −V14 to the piezoelectric driving member 12a so as to maintain the current flowing in the probe 100-b (or 100-c) at a value I02 (constant value).

Figure 8C:
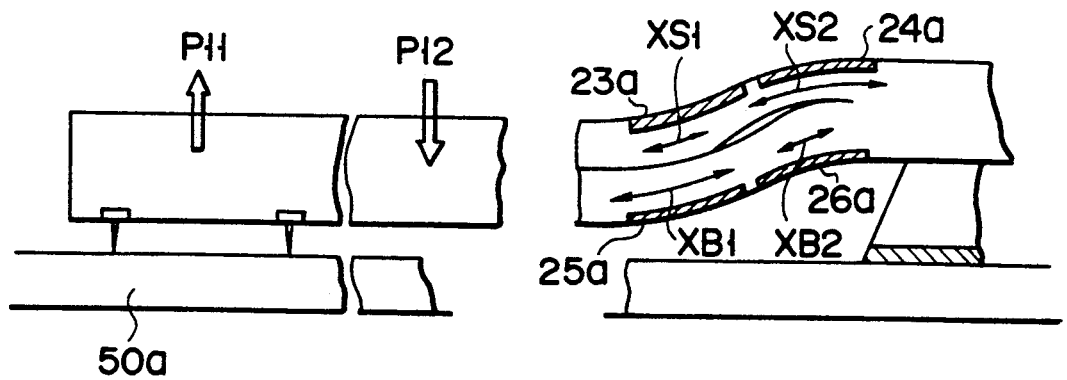

When the piezoelectric driving members 11a and 12a are driven while the tunnel currents I01 and I02 of the probes 100-a (or 100-d) and 100-b (or 100-c) are maintained, the piezoelectric driving members 11a and 12a are respectively deformed in directions indicated by arrows P11 and P12 in FIG. 8C. When the distance between the probe group 1000 and the sample 50a is set to keep the tunnel currents of the probes 100a to 100b constant, the servo circuits 112 and 114 are released and kept in that state.

That is, in this state, the probes 100-a to 100-d oppose the sample 50a in the tunnel current region while a predetermined distance from the sample surface is kept, and the scanning surface of the probe group 1000 becomes perfectly parallel to the sample surface. Therefore, other probes 100-x (x=1, 2, 3, . . .,) can detect tunnel currents through the amplifier 300a in accordance with the irregularity of the opposing sample.

Figure 10:
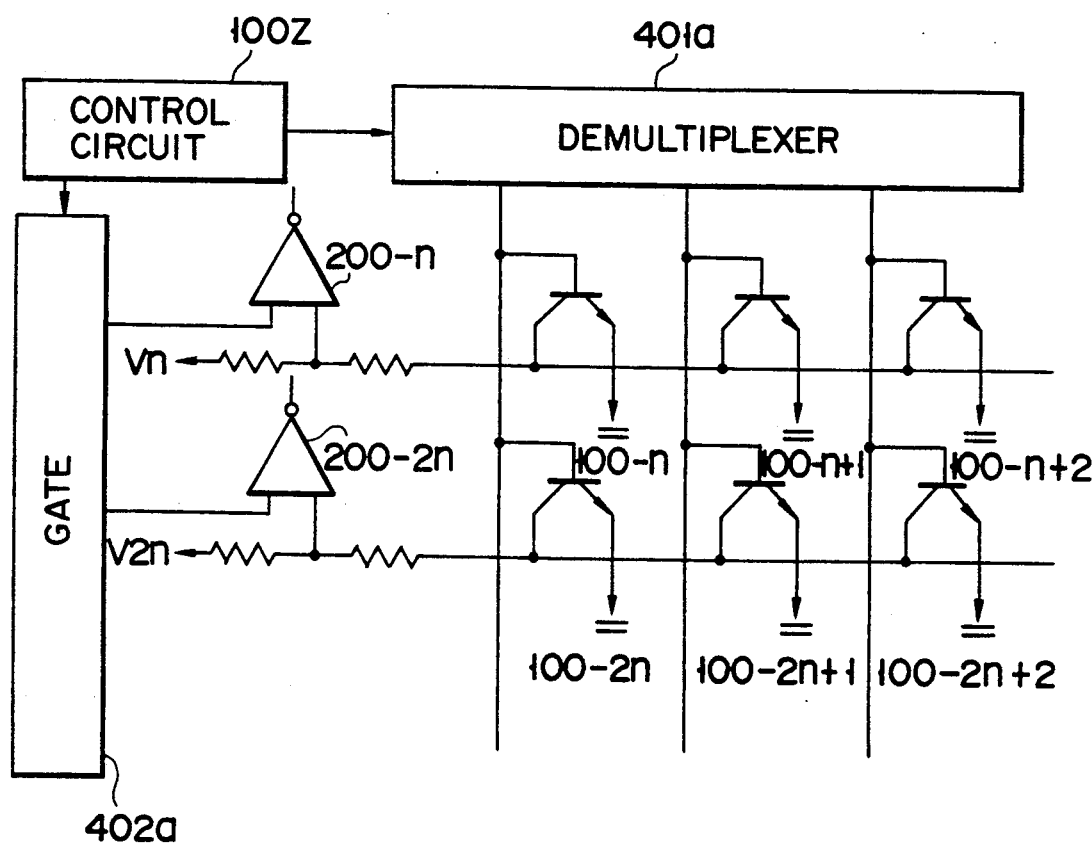
FIG. 10 is a circuit diagram showing group processing of the probe group.

In this case, if the number of probes is large, and signals from the respective probes are to be time-divisionally processed, the probes may be properly grouped so that tunnel current values are read while gate selection is performed by a gate 402a and demultiplex selection is performed by a demultiplexer 401a under the control of the control circuit 100z, as shown in FIG. 10.

In addition, when servo operations of the probes 100-a to 100-d are to be performed by the servo circuits 112 and 114 in the above-described manner, low-pass filters may be added to the servo circuits so that even after the probe group becomes parallel to the sample surface, the servo operations of the servo circuits 112 and 114 are not canceled, and the probes are scanned while the servo operation is performed through the low-pass filters. With this operation, even is external disturbance occurs during observation, contact between the probes and the sample can be prevented, and the sample surface and the probe group ca be set to be parallel to each other again.

STM scanning of the probe group 1000 will be described below.

Figure 11A:
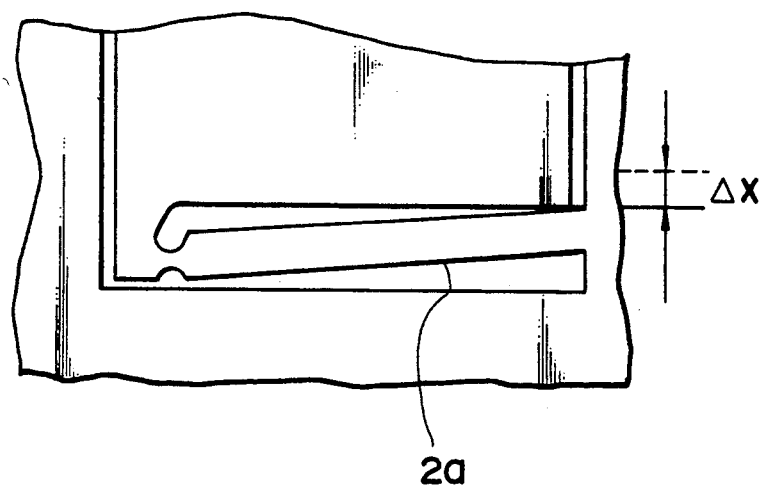
FIGS. 11A and 11B are views respectively showing scanning displacements of cantilevers.

As described above, when source voltages are applied to the respective electronic circuits, such as the tunnel current probes, the piezoelectric driving members, the control circuit, and the tunnel current detectors, while the probe group 1000 is set to be parallel to the sample 50a, the voltages V11 and V12 having the different polarities are alternately applied to the electrodes 21a and 22a of the piezoelectric driving members of the parallel cantilevers 2a and 2b in response to the driving signal V01 (see FIG. 6A) output from the control circuit 100. As a result, the pair of piezoelectric driving members 13a and 14a alternately expand and contract to laterally bend the entire cantilevers 2a and 2b (2b is not shown) and to displace ($\Delta x$) the probe group 1000 in the X direction, as shown in FIG. 11A. That is, entire portions of the cantilevers 2a and 2b, which are located closer to the probes than the cantilevers 3a and 3b, are laterally translated by a distance corresponding to the amplitude of the distal ends of the cantilevers 2a and 2b.

Figure 11B:
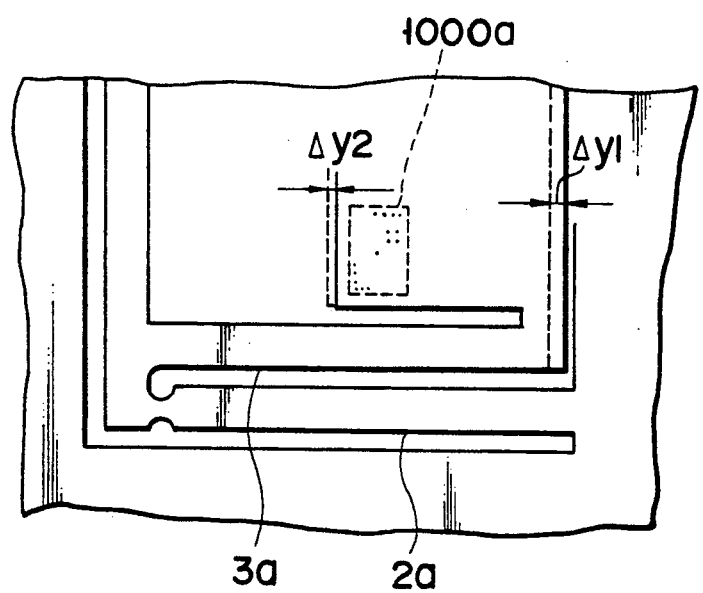

In addition, as shown in FIG. 11B, in response to the driving signal V02 output from the control circuit 100, the piezoelectric driving members 15a and 15b (15b is not shown) for expanding/contracting the cantilevers 3a and 3b, and the piezoelectric driving member 16a for the probe cantilever 4a expand (or contract) the parallel cantilevers 3a and 3b and the probe cantilever 4a by a predetermined amount for every lateral scanning operation by the cantilevers 2a and 2b so as to displace the probe group 1000 in the Y direction. Since expansion and contraction of this displacement have opposite phases as in the circuit shown in FIG. 5, the Y-direction movement length of the probe group 1000 is given as the sum of expansion and contraction amounts ($\Delta y = -\Delta y1 + \Delta y2$). Hence, a large movement length can be obtained.

In this manner, the probes 100-x of the probe group 1000 two-dimensionally arranged on the probe cantilever 4a are two-dimensionally scanned on the observation surface of the sample.

The probes 100-x (100-1, 100-2, 100-3, . . . ) of the probe group 1000 respectively extract tunnel currents at predetermined positions, and transmit them to the amplifier 200a.

Figure 9:
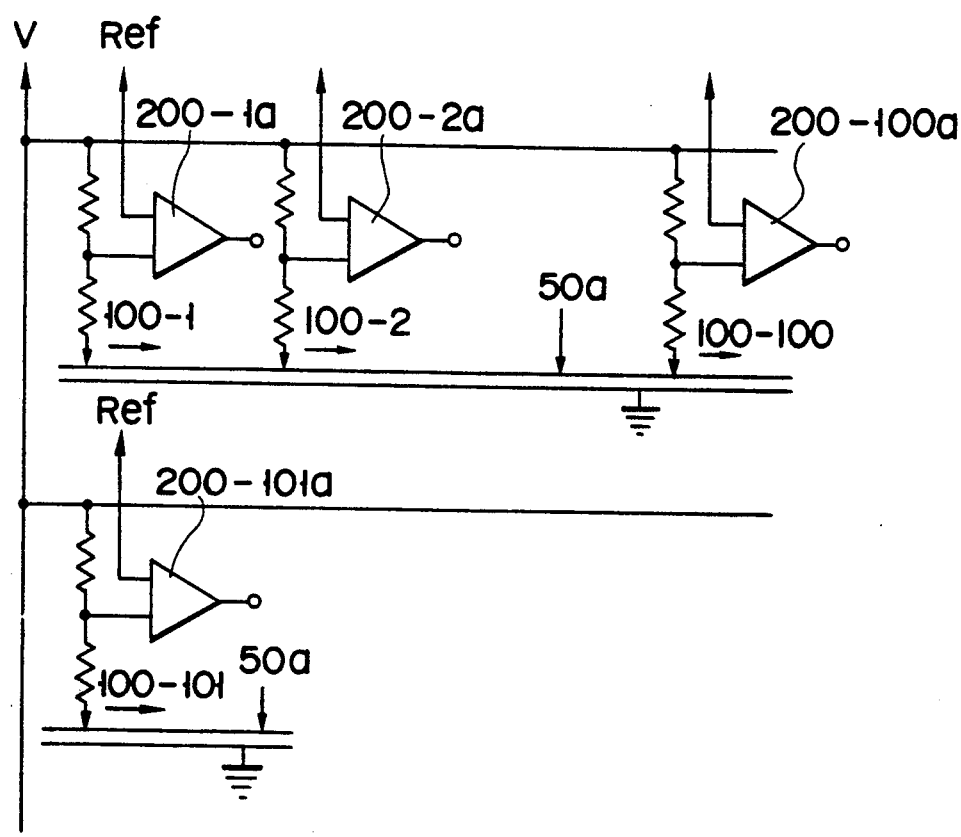
FIG. 9 is a circuit diagram showing a circuit for amplifying tunnel currents.

The amplifier 200a will be briefly described below. FIG. 9 shows the amplifier 200a. When the probe 100-x (100-1, 100-2, 100-3, . . . ) to which a voltage V is applied through resistors is caused to approach the sample 50a, a tunnel current is detected in the amplifier 200-x (200-1, 200-2, 200-3, . . . ). Referring to FIG. 9, reference symbol Ref denotes a terminal to be used in accordance with variations in structure of probes and circuits, and selective control. As described above, in the micro STM of this embodiment, since the probe group 1000 is scanned by the parallel cantilevers 2a and 2b, the probes are not scanned in the form of an arc and ca be linearly scanned to obtain an STM image without distortion, unlike the micro STM shown in FIG. 1.

With these parallel cantilevers, the effective scanning ranges of the probes in the three directions, i.e., the X, Y, and Z directions can be expanded. Since X, Y, and Z displacements with respect to the same driving voltage are not offset, the driving voltage need not be amplified, and the scanning control system of the probes can be simplified. In addition, a substantially square STM image, which allows easy observation, can be obtained. Each probe has its own scanning region determined by the scanning amplitude of the probe cantilever 4a. Therefore, even if the amplitude of each probe is 2 $\mu m$, a scanning range equal to the area of the probe group 1000 can be observed as a whole.

A modification of the micro STM of the present invention will be described below.

FIG. 12 is a plan view showing a modification of the present invention. This modification is different from the embodiment shown in FIG. 2 in that cantilevers 17a and 17b corresponding to the parallel cantilevers 2a and 2b in FIG. 2 are arranged right before a probe group 1000, and cantilevers 18a and 18b corresponding to the parallel cantilevers 3a and 3b in FIG. 2 are additionally arranged between the STM chip substrate 1a and the cantilevers 3a and 3b in FIG. 2. Other portions of this modification are the same as those of the above-described first embodiment, and hence a detailed description thereof will be omitted.

In the micro STM of this modification, each piezoelectric driving member is constituted by a substrate having a large piezoelectric coefficient, such as PZT, and the STM chip substrate 1a and the parallel cantilevers 18a and 18b are integrated by direct bonding, anode bonding, or by means of an adhesive agent. With this arrangement, the Y-direction expansion/contraction length can be further increased, and a stable driving member can be realized.

FIG. 13 is a central sectional view of an STM insertion apparatus for inserting the micro STM of the present invention into the operation range of an optical microscope. In the optical microscope, the observation position of a sample 50a placed on a stage 56, at which observation is performed by the STM, is specified by an objective lens 51 in advance. Arms 54 clamp the STM chip 1a at their distal end portions and are designed to pivot on a rotating shaft 57 in the vertical direction in FIG. 13 with respect to a micro barrel support member 58.

In such an arrangement, when the arms 54 are pivoted to set the STM chip 1a between the object lens 51 and the sample 50a, the STM chip 1a is released by a mechanism (not shown). In this state, probes 53 arranged in the mirror barrel support member 58 are lowered from the member 58 and bring coil spring contacts 52 into contact with contacts 45 arranged on the surface of the STM chip substrate 1a, thus urging-/securing the STM chip substrate 1a on the sample 50a with a predetermined pressure. The contacts 52 are connected to a ground system, a power source system, or a signal system (not shown), and are used for signal processing and display processing of the STM apparatus.

As described above, according to the first embodiment of the present invention, since the scanning range of the probes can be expanded by using the parallel cantilevers, a substantially square STM image which accurately represents the actual fine surface pattern of the sample can be obtained.

The second embodiment of the present invention will be described below with reference to the accompanying drawings. In this embodiment, a tunnel current probe moving mechanism of the present invention is realized as a data memory.

An outline of the second embodiment will be described first.

In this embodiment, first and second substrates are arranged to be adjacent to each other through an intermediate member, and tunnel current probes are not arranged at the distal end of a cantilever, but several hundreds to several thousands probes are arranged by an IC process in an area of several mm × several mm on a central portion of the substrate in the form of a matrix. When a portion around this tunnel current probe group is cut from the main substrate in the form a rectangle by etching, i.e., the probe substrate cut from the main substrate, a plurality of parallel cantilever members having the same length are simultaneously formed to extend from the main substrate. As a result, the probe substrate is supported at the distal ends of the parallel cantilevers to be parallel to each other.

Piezoelectric driving members are arranged on these parallel cantilever members, and a tunnel current detector, drivers and buffer memories of the piezoelectric driving members, a recording/reproducing circuit, an input/output circuit for external/internal units, and the like are arranged on other portions of the substrate by an IC process.

In the present invention, a recording medium is formed on the second substrate by an IC process similar to the above-mentioned IC process so as to oppose the tunnel current probe group, and a recording medium substrate supported by the parallel cantilevers is arranged.

A coupling portion between the parallel cantilevers and the probe substrate or the recording medium substrate has a hinge structure so that when the distal ends of the parallel cantilevers are laterally vibrated in the same direction by the plurality of piezoelectric driving members arranged on the parallel cantilevers, the overall probe cantilever or the recording medium substrate is easily vibrated by displacements of the distal ends of the cantilevers.

Note that an area in which the tunnel current probes are effectively scanned is not limited to the distal ends of the cantilevers, and a considerable area of the overall apparatus can be used to arrange the tunnel current probes while the same amplitude as that of the distal end of each cantilever can be obtained. Since the probe substrate and the recording medium substrate have at least two support points, they are stably operated.

If the effective area of the tunnel current probe or recording medium substrate is set to be, e.g., 3.2 mm × 3.2 mm, and tunnel current probes are arranged at a pitch of 0.8 μm, the number of tunnel current probes is $16 \times 10^6$. Assume that the distance one tunnel current probe scans is 0.4 μm, and the tunnel current probes are used at a recording dot density corresponding to a pitch of 10 nm. In this case, when the probe substrate and the recording medium substrate are relatively moved on a two-dimensional plane, a $256 \times 10^8$-bit memory, i.e., a 25.6-gigabit memory, can be provided. If the recording dot density corresponds to a pitch of 5 nm, a memory having a capacity as large as 102.4 gigabits can be provided.

The second embodiment will be described below wit reference to the accompanying drawings.

FIG. 14 is a plan view of a first substrate 1. FIG. 15 is a bottom view of a second substrate 11. The second substrate 11 has the same outer shape, size, and form as those of the first substrate 1. FIG. 15 shows a state wherein the first substrate 1 is rotated from the state shown in FIG. 14 through 90°. As will be described later, the first and second substrates 1 and 11 are stacked on each other. In addition, each of the substrates 1 and 11 is constituted by a 5 mm × 5 mm base as a chip on a portion of a silicon substrate whose flatness is maintained at a high level.

Cantilever members 3 (or 14) extend parallel from corners 4 along two opposite sides of the four sides of each of the first and second substrates 1 and 2. A probe substrate 2 and a medium substrate 12 are held at the central portions of the substrates 1 and 11 through hinge portions 5 at the distal ends of the cantilevers 3 while the parallelism with the substrates 1 and 11 is maintained. Each of the substrates 2 and 12 has an area of 3 mm × 4 mm. A first U-shaped groove 6 and a second U-shaped groove 7 which is smaller than the first U-shaped groove 6 are formed in the first substrate 1 by a process technique such as etching so as to oppose each other. Semicircular grooves 8 are formed in the hinge portions 5 on the first U-shaped groove 6 side, and the distal ends of the second U-shaped grooves 7 are formed into circular grooves 9. The semicircular grooves 8 and the circular grooves 9 are connected to the probe substrate 2 or the medium substrate 12 so as to narrow the distal ends of the cantilever members 3.

FIG. 16 is a sectional view taken along an alternate long and short dashed line indicated by an arrow S1 in FIG. 14 or 15, illustrating a structure obtained by stacking the substrates 1 and 11, the probe substrate 2, the medium substrate 12, and the like shown in FIGS. 14 and 15 on each other through predetermined spacers 13 and 15 in such a manner that the surfaces of the drawings overlap each other. FIG. 17 shows the structure obtained by stacking the substrates, which is viewed from a direction indicated by an arrow A in FIG. 14.

The spacers 13 and 15 are constituted by conductive layers formed by depositing polysilicon, Al, or the like on the substrate 1 or 11 to a predetermined thickness. With these spacers, the probe substrate 2 and the medium substrate 12 are held to oppose each other at a predetermined interval, and electrical connecting portions thereof are also formed as needed.

FIG. 18 is a partially enlarged perspective view showing a structure of the cantilever member 3 (or 14). FIG. 19 is a sectional view taken along a alternate long and short dashed line indicated by an arrow S2 in FIG. 18. Referring to FIG. 19, strip-like electrodes 31 and 32 are formed on the cantilever member 3 by deposition or the like so as to sandwich a piezoelectric member 30. These electrodes are connected to a control circuit 300 through wires (not shown). Predetermined voltages are applied from this control circuit 300 to the opposite electrodes 31 and 32. As shown in FIG. 19, the electrodes 31 and 32 and the piezoelectric member 30 constitute piezoelectric driving members 33 and 34 which are isolated from each other through a groove 10.

As shown in FIG. 15, electrodes 35 and 36 are arranged parallel along the longitudinal direction of the cantilever member 3. FIG. 20 is a sectional view taken along an alternate long and short dashed line indicated by an arrow S3 in FIG. 15. As is apparent from FIG. 20, electrodes 39 and 37 (38) are arranged parallel on the middle portion and the lower surface of the piezoelectric member 30 so as to oppose the electrodes 35 and 36. The electrodes 35, 36, 37, and 38 are connected to the control circuit 300 through wires (not shown) with the electrodes 39 serving as common electrodes.

Note that the electrodes 35, 39, and 37, and the electrodes 36, 39, and 38 respectively constitute bimorph cells 40 and 41.

As shown in FIG. 14, a conductive probe group 100-X (X=1, 2, 3, ... ; to be simply referred to as a probe group 1000 hereinafter) is arranged on the central portion of the probe substrate 2 supported by the hinge portions 5 at the distal ends of the two parallel cantilever members 3. Each probe has a size on the order of microns or submicrons. The probes are independently arranged to form a two-dimensional lattice. This probe group 1000 is formed by the basic process of the semiconductor manufacturing technique, such as lithography, deposition, and etching. With the development of a low-temperature process and the like along with the recent advancement in the silicon process, the flatness of a local region on a substrate can be maintained at a nanometer level. In addition, according to the method of forming probes using the semiconductor manufacturing process developed at Stanford University, if probes are arranged at a pitch of 0.8 $\mu$m in a 3.2 mm $\times$ 3.2 mm region 100 on a flat member (probe substrate) 2, $400 \times 200 = 16 \times 10^4$ probes can be arranged.

Conductive wires (not shown) are attached to the probe group 1000. The probe group 1000 is grouped for signal processing (to be described later) as needed. The probe group 1000 is connected to selection circuits 400 including multiplexers or amplification functions, which are arranged on peripheral portions of the probe substrate 2 (may be arranged on portions of the probe region). The selection circuits 400 are connected to an input/output circuit 500 by multilayer wiring through the hinge portions 5 and the cantilever members 3 or are designed to communicate with an input/output circuit 600 through light or the like by arranging a transmitter and a receiver to oppose each other through the U-shaped groove 6.

Note that the above-mentioned electrodes, probes, wires, and other circuits are formed by proper manufacturing steps of the semiconductor process.

Referring to FIG. 15, the medium substrate 12 is arranged to oppose the probe substrate 2 and includes a smooth medium surface 200 having substantially the same area as that of the region 100. This medium surface 200 is arranged near the distal end of the probe group 1000, and is designed to trap charge at a high density. The cantilever members 14 coupled the substrate 11 to the medium substrate 12 and include piezoelectric driving members 15 and 16 having the same structure as that of the above-mentioned piezoelectric driving members 33 and 34. These driving members 15 and 16 are connected to the control circuit 300 through wires (not shown).

FIG. 21 shows another embodiment of the above-described cantilever members 3 and 14. Referring to FIG. 21, a groove 10 between electrodes 31 is omitted.

FIG. 22 shows a circuit arrangement of a driving circuit 301 for driving the piezoelectric driving members 33 and 34 and the control circuit 300. A driving signal V01 having a predetermined period f01 is output from an output terminal 307 of the control circuit 300. This driving signal V01 is input to two voltage amplifiers 302 and 303. Power is supplied to the voltage amplifiers 302 and 303 from two negative and positive power sources of 2 to 30 V. As a result, output voltage V11 and V12 having opposite phases are output from output terminals 304 and 305. The output terminals 304 and 305 are respectively connected to the electrodes 31 and 32 of the piezoelectric driving member 33. In addition, the output terminals 305 and 304 are respectively connected to the electrodes 31 and 32 of the piezoelectric driving member 34. Assume, in this case, that the driving voltage V01 shown in FIG. 23A is output from the output terminal 307. When the driving signal V01 has a peak value V, an electric field E is generated between the electrodes 31 and 32 of the piezoelectric driving member 33.

A similar driving circuit is connected to the piezoelectric driving members 15 and 16. In this case, a driving signal V02 output from an output terminal 309 has a waveform shown in FIG. 23B. This driving signal V02 satisfies f01=2Nf02 (N is an integer), and hence has a step-like waveform having N different amplitudes, as shown in FIG. 23B.

Figure 25B:
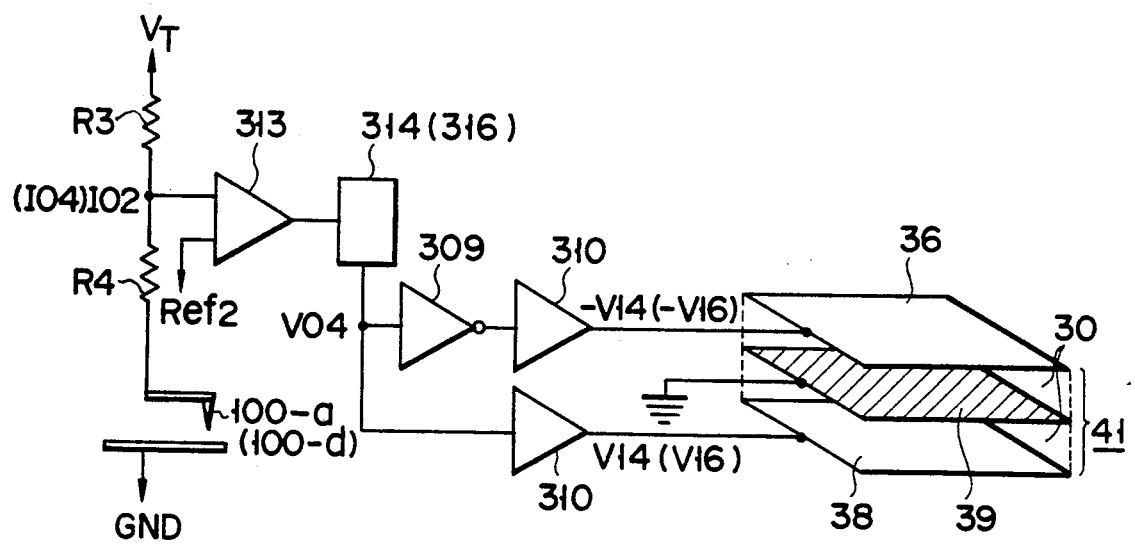

As shown in FIGS. 25A and 25B, the piezoelectric member 30 is sandwiched between the common electrode 39 and the electrode 35 (36) on the upper surface, and between the common electrode 39 and the electrode 37 (38) on the lower surface. That is, the bimorph cell 40 (41) constitutes a compound bimorph cell.

Assume that probes 100-1, 100-a, 100-b, and 100-c are arranged at the four corners on the probe substrate 1 shown in FIG. 14. Of these probes, the probe 100-1 (or 100-c), which is located near the hinge portion 5, is used as a tunnel current probe for driving the bimorph cell 40. A tunnel current detected by the probe 100-1 is supplied to a servo circuit 312 through a tunnel current detector 311. An output voltage V03 from the servo circuit 312 is applied to the electrode 35 as a voltage 15 through an amplifier 310. At the same time, he voltage V03 is applied to the electrode 37 as a voltage $-V13$ through an inverter 309 and an amplifier 310. In this manner, positive and negative voltage V13 and $-V13$ are respectively applied to the electrodes 35 and 37 with respect to the common electrode 39.

The probe 100-a (or 100-b), which is located farthest from the hinge portion 5, is used as a tunnel probe for driving the bimorph cell 41. A tunnel current detected by the probe 100-a is supplied to a servo circuit 314 through a tunnel current detector 313. An output voltage V04 from the servo circuit 314 is applied to the electrode 38 as a voltage V14 through an amplifier 310. At the same time, the voltage V04 is applied to the electrode 36 as a voltage $-V14$ through an inverter 309 and an amplifier 310. In this manner, negative and positive voltages $-V13$ and $+V13$ are respectively applied to the electrodes 36 and 38 with respect to the common electrode 39.

Figure 26:
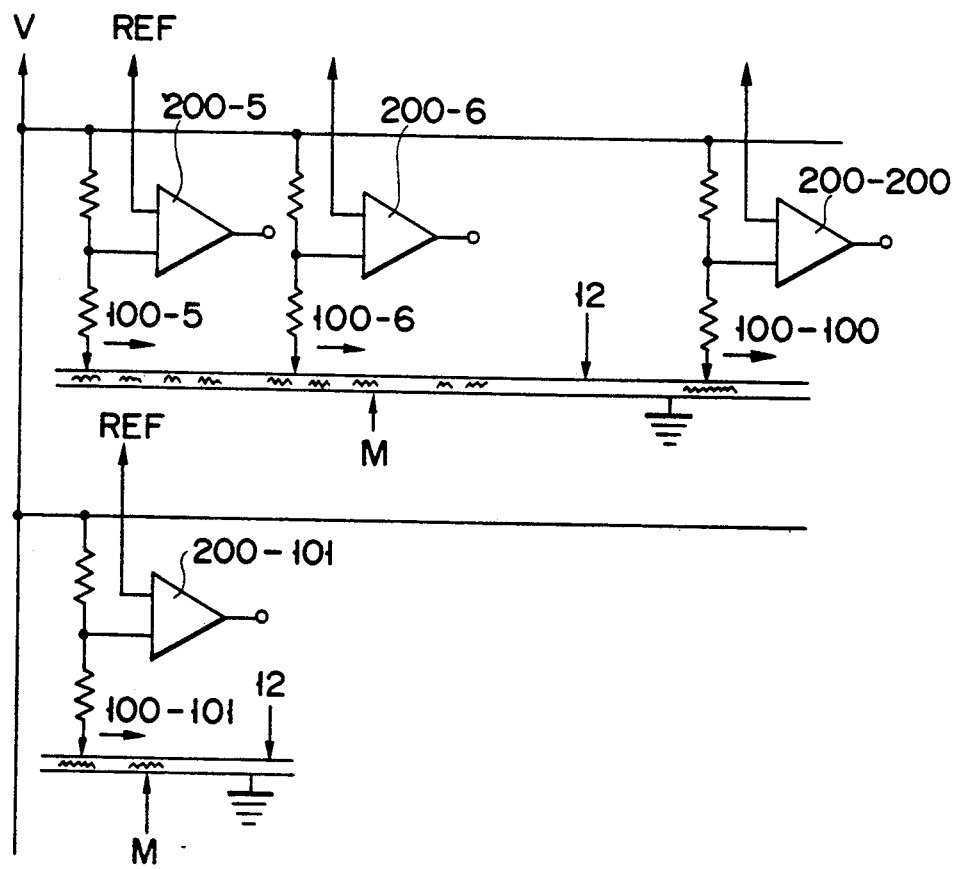
FIG. 26 is a view showing a circuit for reading data from a medium.

As shown in FIG. 26, of the probe group 1000, the probes other than the above-described probes (100-1, 100-a, 100-b, and 100-c) are connected to a current detector group 200 through the selection circuit 400 so as to read the respective data on the recording medium region arranged on the medium substrate 12. Referring to FIG. 26, an REF input terminal is used as needed in accordance with variations in structure of probes and circuits and selection control.

In addition, a large number of probes 100-X and leads are arranged on the probe substrate. When the probes 100-X are arranged so close to each other and the lead arrangement for each probe is difficult, the probe group 1000 may be divided into groups, as shown in FIG. 27. With this arrangement, a tunnel current from the probe 100-2n, for example, is detected at the output O2n of the amplifier 400-2n by selecting corresponding terminals of a demultiplexer 401 and a gate 402 by means of the control circuit 300.

In order to set and maintain the probe substrate 2 at a position close to the tunnel current region of the medium substrate 12, the bimorph cells 40 and 41 may be replaced with piezoelectric members. With this arrangement, since the spacers 13 and 15 shown in FIGS. 16 and 17 also serve as piezoelectric driving members, the same control operation as performed by the bimorph cells 40 and 41 can be performed.

An operation of the memory having the above-described arrangement according to the present invention will be described below.

Power source voltages are applied to the probes, the piezoelectric driving members, and the respective electronic circuits including the control circuit and the tunnel current detectors. A driving signal V01 output from the control terminal (output terminal) 307 of the control circuit 300 is supplied to the piezoelectric driving members 33 and 34 of the parallel cantilevers 3 which support the probe substrate 2. As a result, voltages having different polarities or voltages V11 and V12 having different polarities and different potentials are alternately applied to the electrodes 31 and 32. At this time, the pair of the piezoelectric driving members 33 and 34 opposing each other through the groove 10 alternately expand and contract to laterally bend the parallel cantilevers 3 and the probe substrate 2 is laterally translated as a whole by the amplitude of the distal end of each cantilever 3. Since the parallel cantilevers 14 coupled to the medium substrate 12 are supported to extend in a direction perpendicular to the parallel cantilevers 3, both the substrates are two-dimensionally moved by the same driving operation as described above. Therefore, each of the probes 100-X of the probe group 1000 two-dimensionally arranged on the probe substrate 2 scans the area based on the amplitude of the medium surface of the medium substrate 12.

Meanwhile, driving voltages V13 and V14 or V15 and V16 are applied from the control circuit 300 to the bimorph cells 40 and 41 with servo control as shown in FIG. 24 so as to translate the probe substrate 2 and the medium substrate 12 to approach each other up to a distance at which a tunnel current flows in a medium region 2000 between each probe 100-X and the medium substrate 12.

According to the data memory of the present invention, since the probe substrate 2 and the medium substrate 12 are separated at a predetermined distance upon manufacturing, no tunnel current flows before the power source is turned on. After the power source is turned on, the control circuit 300 applies voltages to the electrodes 36 and 38 of the bimorph cell 41 so as to generate predetermined potential differences with respect to the common electrode 39. Since expansion/contraction values XS2 and XL2 of the upper and lower layers of the piezoelectric member 30 between the electrodes satisfy XS2<XL2, the upper layer becomes shorter than the lower layer, and the distal end of the cantilever 14 is raised due to bending. As a result, the probe 100-1 (or 100-c) located near the distal end approaches the tunnel region first. The tunnel current detector 311 operates the servo circuit 312 to maintain a tunnel current flowing in the probe 100-1 (or 100-c) located in the tunnel current region at a predetermined current I01. The amplifier 310 then outputs the voltage V13 (V15) to the bimorph cell 41. Meanwhile, the voltage V14 is applied to each of the electrodes 35 and 37 of the bimorph cell 40. As a result, contrary to the effect on the bimorph cell 41, expansion/contraction values XL1 and XS1 of the upper and lower layers satisfy XL1>XS1, and the distal end of the cantilever 14 is bent downward. When the bimorph cell 40 is driven in the above-described manner while the tunnel current I01 flowing in the probe 100-1 (or 100-c) is kept constant, the bimorph cell 41 moves the position of the cantilever 14 in a direction indicated by an arrow P41, and the bimorph cell 40 moves the position of the cantilever 14 in a direction indicated by an arrow P40. At this time, the probe substrate 2 and the medium substrate 12 are controlled by the servo circuits 312 (315) and 314 (316) so as to be parallel to each other at a distance by which the tunnel current flowing in the probe 100-1 is kept constant. That is, in a normal state, the probe group 1000 opposes the medium at the distance corresponding to the tunnel current region. As shown in FIG. 26, in this state, when a voltage V is applied to the groups (100-2, 100-3, 100-4, . . . ) which are properly divided into groups, and the opposing medium is in a predetermined state, each probe 100-X can detect a tunnel current through a corresponding detector 200-X (X=5, 6, . . . ).

As described above, the probe substrate 2 and the medium substrate 12 are scanned to be parallel to each other by the cantilevers 3 and 14 by driving the piezoelectric driving members 33 and 34 extending in the orthogonal directions. Since the probe 100-X (X=5, 6, . . . ) opposes the medium substrate 12 at a distance corresponding to the tunnel current region, when it is moved in a direction indicated by an arrow above the medium substrate 12 in FIG. 26, the corresponding detector 200-X (X=5, 6, . . . ) detects a tunnel current at a position corresponding to a predetermined state M of the medium.

Each probe has its own scanning region determined by the scanning amplitude of each of the medium substrate 12 and the probe substrate 2. If the amplitude is 0.8 m and the recording density of the medium is 2 nm, 400 bits per amplitude, i.e., $16 \times 10^4$-bit data in the scanning region can be processed. These probes are controlled in groups by the demultiplexer 410, the gate 402, and the like, which are controlled by the control circuit 300, by the known method of matching the driving signals (FIGS. 23A and 23B) with the timings of the scanning systems, thereby recording/reproducing data on the medium.

According to the second embodiment of the present invention, the probe substrate, on which the tunnel current probes are formed at a pitch of the submicron order by the IC process, is scanned on the recording medium by using the parallel cantilevers including the piezoelectric driving members which are formed also by the IC process. With this operation, the entire probe substrate is translated at the amplitude of the distal ends of the parallel cantilevers, and each tunnel current probe performs effective scanning. That is, a one-chip memory having a capacity of several gigabits can be constituted by a combination of an integral substrate and a circuit formed by the same IC process as used for the integral substrate.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A tunnel current probe moving mechanism comprising:
   a first substrate including a tunnel current probe group on a surface thereof, said tunnel current probe group including tunnel current probes two-dimensionally arranged at a predetermined pitch and having distal ends aligned within the same plane;
   a second substrate arranged to oppose said tunnel current probe group on said first substrate and capable of approaching a position where a tunnel current flows between said tunnel current probe group and said second substrate; and
   at least three substantially parallel cantilevers, having the same length and arranged substantially parallel to each other on at least one of said first and second substrates, each of said cantilevers including a plurality of piezoelectric driving members, wherein when said piezoelectric driving members are driven in response to a predetermined driving signal, said probe group is translated along said second substrate while a predetermined distance is kept between said probe group and said second substrate;
   said at least three substantially parallel cantilevers comprising first, second, and third substantially parallel cantilevers, each arranged independently
   said plurality of piezoelectric driving members including first, second, and third piezoelectric driving members;
   said probe group being arranged on said third parallel cantilever;
   said first substantially parallel cantilever comprising said first piezoelectric driving member for moving said probe group in a direction perpendicular to a longitudinal direction of said first cantilever within said same plane;
   said second piezoelectric driving member being arranged for moving said probe group in a direction perpendicular to said same plane; and
   said second and third substantially parallel cantilevers comprising said third piezoelectric driving member for respectively moving said second and third substantially parallel cantilevers in longitudinal directions thereof within said same plane.

2. A mechanism according to claim 1, wherein said cantilevers are respectively arranged on said first and second substrates so as to be perpendicular to each other, and wherein said tunnel probe group and said second substrate are translated at a pitch substantially equal to the array pitch of the probes, by means of said cantilevers.

3. A scanning tunneling microscope for observing a fine surface pattern of a sample by using a tunnel current flowing between the sample and probes, comprising:
   a first substrate directly placed on a surface of the sample;
   a second substrate having a probe group extending therefrom, said probe group including probes two-dimensionally arranged at a predetermined pitch and having distal ends aligned within the same plane; and
   at least three substantially parallel cantilevers, having the same length and arranged substantially parallel to each other on said second substrate, one of said parallel cantilevers including one end connected to said second substrate, and each of said parallel cantilevers having a plurality of piezoelectric driving members, wherein said piezoelectric driving members are driven in response to a predetermined driving signal, and said probe group is translated along the surface of the sample while a predetermined distance is kept between said probe group and the surface of the sample;
   said at least three substantially parallel cantilevers comprise first, second, and third parallel cantilevers, each independently arranged on said second substrate;
   said plurality of piezoelectric driving members including first, second, and third piezoelectric driving members;
   said probe group being arranged on said third parallel cantilever;
   said first substantially parallel cantilever comprising the first piezoelectric driving member for moving said probe group in a direction perpendicular to a longitudinal direction of said first cantilever within said same plane;
   said second piezoelectric driving member being arranged for moving said probe group in a direction perpendicular to said same plane; and
   said second and third substantially parallel cantilevers comprising said third piezoelectric driving member for respectively moving said second and third substantially parallel cantilevers in longitudinal directions thereof within said same plane.

4. A microscope according to claim 3, wherein said first piezoelectric driving member comprises a piezoelectric member, an electrode embedded in the middle of said piezoelectric member, and a plurality of electrodes arranged on upper and lower surfaces opposing said electrode in series in the longitudinal direction of said first cantilever.

5. A microscope according to claim 3, wherein said second piezoelectric driving member comprises a piezoelectric member and a plurality of strip-like electrodes arranged on the upper and lower surfaces of said piezoelectric member in parallel in the longitudinal direction of said first cantilever.

6. A microscope according to claim 3, wherein said third piezoelectric driving member comprises a piezoelectric member and electrodes arranged on the upper and lower surfaces of said piezoelectric member.

7. A microscope according to claim 3 wherein said first cantilever is arranged right before said probe group, and said second cantilever comprises a plurality of cantilevers.

8. A data memory apparatus comprising:
   a first substrate including a tunnel current probe group having two-dimensionally arranged probes;

a second substrate having a recording medium arranged to oppose said tunnel current probe group; and at least two parallel cantilevers, having the same length and arranged parallel to each other on said first and second substrates respectively, said at least two parallel cantilevers having one ends and another ends, said one ends supporting a corresponding one of said first and second substrates, and each of said at least two parallel cantilevers including a plurality of piezoelectric driving members, wherein when said piezoelectric driving members are driven, said probe group is translated along said second substrate while a predetermined distance is kept between said probe group and said second substrate.

9. An apparatus according to claim 8, wherein said at least two parallel cantilevers on said first and second substrates are arranged to be perpendicular to each other.

10. An apparatus according to claim 8, wherein said first substrate comprises a probe substrate coupled to said at least another ends of said two parallel cantilevers, and said probe group is arranged on said probe substrate.

11. An apparatus according to claim 10, wherein said probe substrate is coupled to said another ends of said at least two parallel cantilevers through hinge portions.

12. An apparatus according to claim 8, wherein said second substrate comprises a medium substrate including a medium region, arranged on a central portion thereof, for storing desired data.

13. An apparatus according to claim 12, wherein said medium substrate is coupled to said at least two parallel cantilevers through hinge portions.

14. An apparatus according to claim 8, wherein said first and second substrates are stacked on each other through a spacer.

15. An apparatus according to claim 8, wherein each of said at least two parallel cantilevers comprises a piezoelectric member and strip-like electrodes arranged on the upper and lower surfaces of said piezoelectric member so as to extend along a longitudinal direction of said cantilevers.

16. An apparatus according to claim 15, wherein each of said at least two parallel cantilevers further comprises a groove for separating said strip-like electrodes from each other.

17. An apparatus according to claim 8, wherein each of said at least two parallel cantilevers arranged on said second substrate comprises a piezoelectric member, a common electrode arranged in the middle thereof, and electrodes arranged on the upper and lower surfaces of said piezoelectric member.

18. An apparatus according to claim 8, wherein:
said tunnel current probe group includes at least three probes; and
said apparatus further comprises means for controlling said piezoelectric driving members so as to make said first and second substrates parallel, by detecting values of said tunnel current flowing in said at least three probes of said tunnel current probe group.

19. A tunnel current probe moving mechanism comprising:
a first substrate having a tunnel current probe group on a surface thereof, said tunnel current probe group including at least three tunnel current probes arranged in a two-dimensional matrix having a predetermined pitch in two directions which are perpendicular to each other and having distal ends aligned within one plane;

a second substrate arranged so as to oppose said tunnel current probe group on said first substrate and capable of approaching a position where a tunnel current flows between said tunnel current probe group and said second substrate; and at least two substantially parallel cantilevers, having a same length and arranged substantially parallel to each other on at least one of said first and second substrates, said probe group being translated at a pitch substantially equal to said predetermined pitch along said second substrate while a predetermined distance is kept between said probe group and said second substrate.

20. A mechanism according to claim 19, wherein said cantilevers have distal ends which are secured on said at least one of said first and second substrate, said at least one substrate being translated in X and Y directions which are perpendicular to each other.

21. A tunnel current probe moving mechanism comprising:
a first substrate including a tunnel current probe group on a surface thereof, said tunnel current probe group including tunnel current probes two-dimensionally arranged at a predetermined pitch and having distal ends aligned within the same plane;

a second substrate arranged to oppose said tunnel current probe group on said first substrate and capable of approaching a position where a tunnel current flows between said tunnel current probe group and said second substrate; and at least two substantially parallel cantilevers, having the same length and arranged substantially parallel to each other on at least one of said first and second substrates, each of said cantilevers including a plurality of driving members, wherein when said driving members are driven in response to a predetermined driving signal, said probe group is translated along said second substrate while a predetermined distance is kept between said probe group and said second substrate;

said cantilevers being respectively arranged on said first and second substrates so as to be perpendicular to each other; and said tunnel probe group and said second substrate are translated at a pitch substantially equal to the array pitch of the probes, by means of said cantilevers.

22. A scanning tunneling microscope for observing a fine surface pattern of a sample by using a tunnel current flowing between the sample and probes, comprising:
a first substrate directly placed on a surface of the sample;

a second substrate having a probe group extending therefrom, said probe group including probes two-dimensionally arranged at a predetermined pitch and having distal ends aligned within the same plane; and at least two parallel cantilevers, having the same length and arranged substantially parallel to each other on said second substrate, one of said parallel cantilevers including one end connected to said second substrate, and each of said parallel cantilevers having a plurality of driving members, wherein said driving members are driven in response to a predetermined driving signal, and said probe group is translated along the surface of the sample while a predetermined distance is kept between said probe group and the surface of the sample;

said cantilevers being respectively arranged on said first and second substrates so as to be perpendicular to each other; and said tunnel probe group and said second substrate are translated at a pitch substantially equal to the array pitch of the probes, by means of said cantilevers.

23. A mechanism according to claim 22, further comprising a metal elastic body which is pressed tightly against said second substrate.

24. A mechanism according to claim 23, wherein said metal elastic body serves as input and output terminals of a STM circuit and a data display device.

* * * * *